(12) United States Patent
Kishida et al.

(10) Patent No.: US 9,012,914 B2
(45) Date of Patent: Apr. 21, 2015

(54) THIN-FILM TRANSISTOR AND METHOD FOR MANUFACTURING THIN-FILM TRANSISTOR

(71) Applicant: Panasonic Corporation, Osaka (JP)

(72) Inventors: Yuji Kishida, Hyogo (JP); Kenichirou Nishida, Hyogo (JP); Mitsutaka Matsumoto, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/130,941

(22) PCT Filed: May 29, 2013

(86) PCT No.: PCT/JP2013/003383
§ 371 (c)(1),
(2) Date: Jan. 6, 2014

(87) PCT Pub. No.: WO2013/183251
PCT Pub. Date: Dec. 12, 2013

(65) Prior Publication Data
US 2014/0124783 A1 May 8, 2014

(30) Foreign Application Priority Data

Jun. 8, 2012 (JP) ................................. 2012-131319

(51) Int. Cl.
*H01L 29/10* (2006.01)
*H01L 21/00* (2006.01)
(Continued)

(52) U.S. Cl.
CPC ........... *H01L 27/127* (2013.01); *H01L 27/3262* (2013.01); *H05B 33/08* (2013.01);
(Continued)

(58) Field of Classification Search
CPC .............. H01L 27/127; H01L 27/1222; H01L 27/1225; H01L 29/66765; H01L 29/66969; H01L 29/7869; H01L 29/78696; H01L 27/3262; Y02B 20/346; Y02B 20/341; H05B 33/08
USPC .......... 257/57, 59, 66, 347, 58; 438/149, 151, 438/158, 104, 159
See application file for complete search history.

(56) References Cited

U.S. PATENT DOCUMENTS 6,759,283 B2     7/2004   Yasuda et al.
(Continued)

FOREIGN PATENT DOCUMENTS

JP          09-008311         1/1997
(Continued)

OTHER PUBLICATIONS

International Search Report, mailed Aug. 27, 2013, in corresponding International Application No. PCT/JP2013/003383.

*Primary Examiner* — Nikolay Yushin
(74) *Attorney, Agent, or Firm* — Greenblum & Bernstein, P.L.C.

(57) ABSTRACT

A method for manufacturing a thin-film transistor includes: preparing a substrate; forming a gate electrode above the substrate; forming a gate insulating layer above the gate electrode; forming a semiconductor film above the gate insulating layer; forming, above the semiconductor film, a protective layer comprising an organic material; forming a source electrode and a drain electrode which are opposed to each other and each of which has at least a portion located above the protective layer; forming a semiconductor layer patterned, by performing dry etching on the semiconductor film; and performing, in a hydrogen atmosphere, plasma treatment on an altered layer which (i) is a surface layer of the protective layer exposed from the source electrode and the drain electrode and altered by the dry etching, and (ii) has at least a portion contacting a surface of the semiconductor layer.

19 Claims, 16 Drawing Sheets

(51) Int. Cl.
*H01L 27/12* (2006.01)
*H05B 33/08* (2006.01)
*H01L 29/66* (2006.01)
*H01L 29/786* (2006.01)
*H01L 27/32* (2006.01)

(52) U.S. Cl.
CPC ........ *H01L27/1222* (2013.01); *H01L 27/1225* (2013.01); *H01L 29/66765* (2013.01); *H01L 29/66969* (2013.01); *H01L 29/7869* (2013.01); *H01L 29/78696* (2013.01); *H05B 33/0896* (2013.01)

(56) References Cited

U.S. PATENT DOCUMENTS

| | | | |
|---|---|---|---|
| 6,777,325 B2 * | 8/2004 | Ryuzaki et al. | 438/637 |
| 7,576,394 B2 * | 8/2009 | Furuta et al. | 257/347 |
| 7,768,009 B2 * | 8/2010 | Kobayashi et al. | 257/59 |
| 7,791,075 B2 | 9/2010 | Kobayashi et al. | |
| 8,133,771 B2 | 3/2012 | Kobayashi et al. | |
| 8,389,993 B2 | 3/2013 | Kobayashi et al. | |
| 8,420,462 B2 | 4/2013 | Kobayashi et al. | |
| 2002/0171084 A1 | 11/2002 | Yasuda et al. | |
| 2003/0201465 A1 * | 10/2003 | Ryuzaki et al. | 257/200 |
| 2007/0187760 A1 * | 8/2007 | Furuta et al. | 257/347 |
| 2009/0057672 A1 * | 3/2009 | Kobayashi et al. | 257/59 |
| 2009/0065784 A1 | 3/2009 | Kobayashi et al. | |
| 2010/0285624 A1 | 11/2010 | Kobayashi et al. | |
| 2010/0304515 A1 | 12/2010 | Kobayashi et al. | |
| 2012/0129288 A1 | 5/2012 | Kobayashi et al. | |

FOREIGN PATENT DOCUMENTS

| | | |
|---|---|---|
| JP | 10-073841 | 3/1998 |
| JP | 10-189499 | 7/1998 |
| JP | 2002-261287 | 9/2002 |
| JP | 2003-037270 | 2/2003 |
| JP | 2009-076894 | 4/2009 |
| JP | 2009-081425 | 4/2009 |
| JP | 2011-205105 | 10/2011 |

* cited by examiner (a)　　　　　　　　　(b)

(a)　　　　　　　　　(b)

(a)　　　　　　　　　(b)

(a) (b)

(a) (b)

(a) (b)

(a)  (b)

[Conventional example]

Gate Voltage Vgs [V]

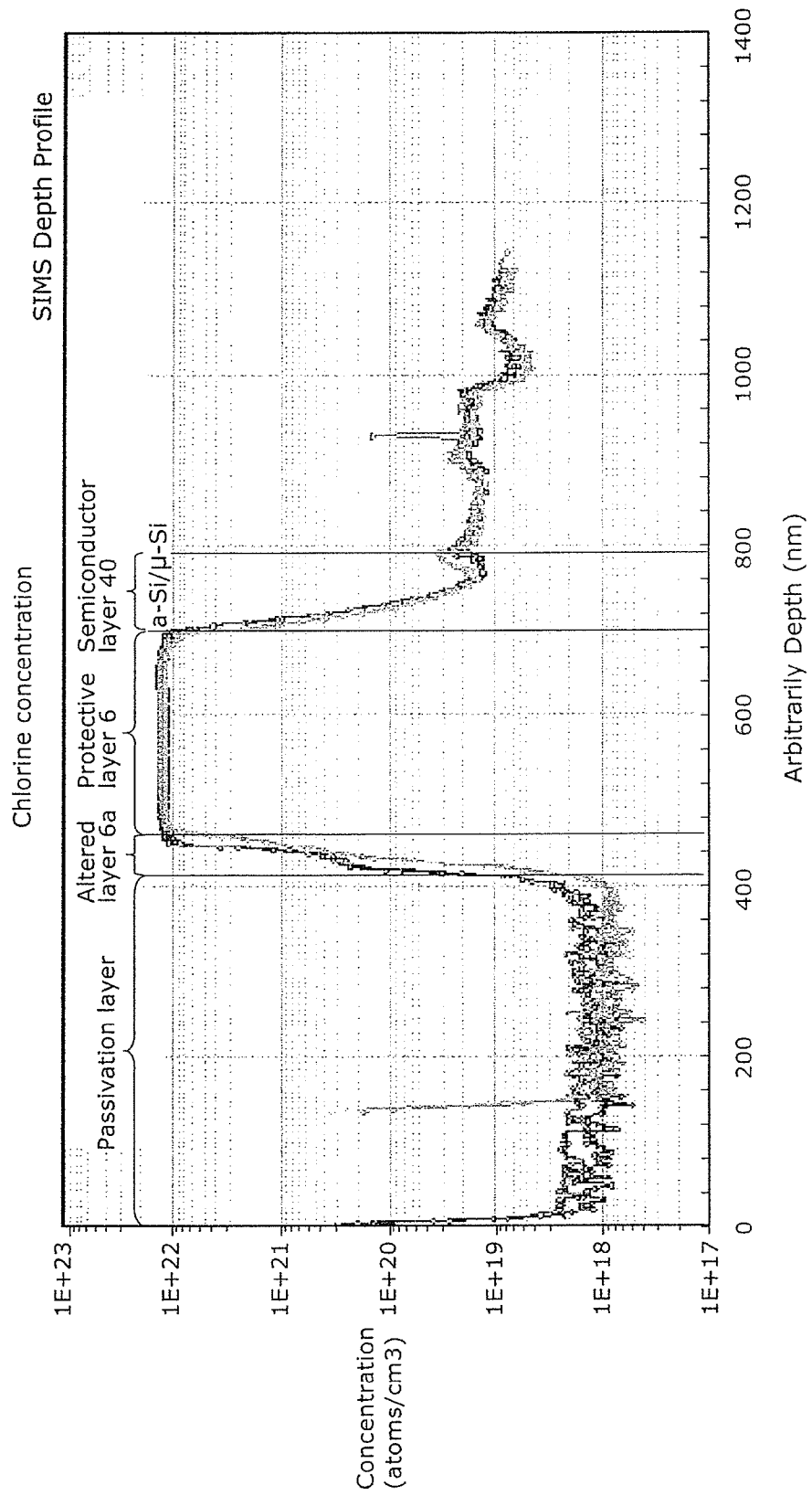

1

THIN-FILM TRANSISTOR AND METHOD FOR MANUFACTURING THIN-FILM TRANSISTOR

TECHNICAL FIELD

The present invention relates to thin-film transistors and methods for manufacturing the thin-film transistors, and particularly to a thin-film transistor including an etch-stopper layer comprising organic application materials, and a method for manufacturing the thin-film transistor.

BACKGROUND ART

In recent years, organic EL displays using electroluminescence (EL) of an organic material have been attracting attention as a type of next-generation flat panel display replacing liquid crystal displays. In an active-matrix display device such as the organic EL display, a thin-film semiconductor device referred to as a thin-film transistor (TFT) is used.

Unlike the voltage-driven liquid crystal display, the organic EL display is a current-driven display device. Accordingly, there is an urgent need for development of a thin-film transistor having excellent turn-on/off characteristics as a driving circuit for the active-matrix display device. The thin-film transistor includes a gate electrode, an insulating layer, a semiconductor layer (channel layer), a source electrode, and a drain electrode formed above a substrate. Generally, a silicon thin-film is used as the channel layer.

Increased size and reduced cost are also required for the display device, and a bottom-gate thin-film transistor in which a gate electrode is formed on a side close to the substrate with respect to the channel layer is generally used as a thin-film transistor which allows cost reduction easily.

The bottom-gate thin-film transistor is generally divided into two types; namely, a channel etching thin-film transistor which includes an etched channel layer, and an etch-stopper (channel protective) thin-film transistor in which the channel layer is protected from etching.

Compared to the etch-stopper thin-film transistor, the channel etching thin-film transistor has advantages in the reduced number of photolithography process and a lower manufacturing cost.

In contrast, with the etching-stopper thin-film transistor, it is possible to prevent the damage on the channel layer by etching, suppressing an increase in the variation of characteristics within a surface of the substrate. Furthermore, the channel layer of the etch-stopper thin-film transistor can be thinner than the channel layer of the channel etching thin-film transistor. Accordingly, parasitic resistance component can be reduced and the turn-on characteristics can be improved, which are advantageous for increasing definition.

Therefore, the etch-stopper thin-film transistor is suitable for a driving transistor in the current-driven organic EL display device using an organic EL element, for example, and there are attempts to use the etch-stopper thin-film transistor in a pixel circuit in the organic EL display device even if the manufacturing cost is higher than the manufacturing cost when the channel-etching thin-film transistor is used.

For example, patent literature 1 discloses an etch-stopper TFT in which a microcrystalline semiconductor film is used as a channel layer, and an etch-stopper layer is formed above a channel layer with a buffer layer provided in between.

CITATION LIST

Patent Literature

PTL 1

Japanese Unexamined Patent Application Publication No. 2009-076894

SUMMARY OF INVENTION

Technical Problem

However, use of organic materials for the etch-stopper layer in the etch-stopper thin-film transistor causes a marked hump referred to as hump phenomenon in the transistor characteristics (I-V characteristics).

In particular, such marked hump phenomenon appears in a region in which current of the transistor characteristics rapidly increases. The region in which current rapidly increases corresponds to a low gray scale region, that is, a black display region in a display device. Unlike the liquid crystal display, the characteristics in the black display region are important for the organic EL display.

The present invention has been conceived to solve the above problem, and has an object to provide (i) an etch-stopper thin-film transistor including an etch-stopper layer comprising organic materials, with reduced hump phenomenon and (ii) a method for manufacturing the thin-film transistor.

Solution to Problem

In order to achieve the above object, the method for manufacturing the thin-film transistor according to an aspect of the present invention includes: preparing a substrate; forming a gate electrode above the substrate; forming a gate-insulating layer above the gate electrode; forming a semiconductor film above the gate insulating layer; forming, above the semiconductor film, an etch-stopper layer comprising an organic material; forming a source electrode and a drain electrode that are opposed to each other, each of the source electrode and the drain electrode having at least a portion located above the etch-stopper layer; forming a semiconductor layer patterned, by performing dry etching on the semiconductor film; and performing plasma treatment on an altered layer in a hydrogen atmosphere, the altered layer being a surface layer of the etch-stopper layer that is (i) exposed from the source electrode and the drain electrode and (ii) altered by the dry etching, the altered layer having at least a portion contacting a surface of the semiconductor layer.

Advantageous Effects of Invention

According to an aspect of the present invention, it is possible to provide a thin-film transistor with excellent transistor characteristics, in particular, where hump phenomenon is reduced in a region in which current rapidly increases.

BRIEF DESCRIPTION OF DRAWINGS

In FIG. 1, (a) shows a cross-sectional view of the thin-film transistor taken along line A-A' in (b), (b) shows a perspective plan view of the thin-film transistor, and (c) shows an enlarged cross-sectional view of the thin-film transistor taken along line B-B' in (b).

In FIG. 4, (a) shows a cross-sectional view of the thin-film transistor taken along line A-A' in (b), (b) shows a perspective plan view of the thin-film transistor, and (c) shows an enlarged cross-sectional view of the thin-film transistor taken along line B-B' in (b).

FIG. 8B shows concentration distribution of carbon in the films of the conventional thin-film transistor shown in FIG. 4.

In FIG. 12, (a) shows a cross-sectional view of the thin-film transistor taken along line A-A' in (b), and (b) shows a perspective plan view of the thin-film transistor.

DESCRIPTION OF EMBODIMENTS

Figure 1:
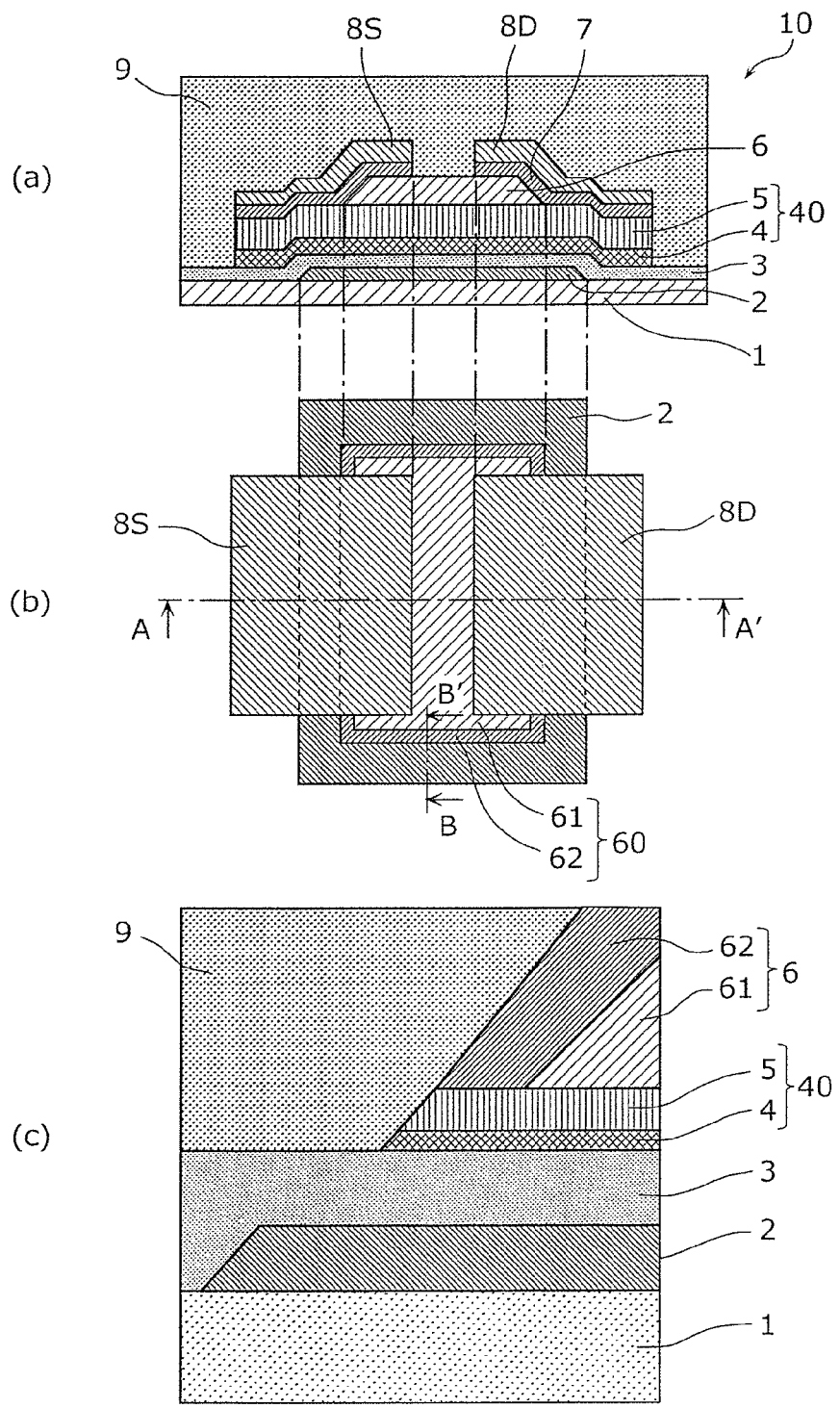
FIG. 1 schematically shows a configuration of a thin-film transistor according to an embodiment of the present invention.

The method for manufacturing the thin-film transistor according to an aspect of the present invention includes: preparing a substrate; forming a gate electrode above the substrate; forming a gate insulating layer above the gate electrode; forming a semiconductor film above the gate insulating layer; forming, above the semiconductor film, an etch-stopper layer comprising an organic material; forming a source electrode and a drain electrode that are opposed to each other, each of the source electrode and the drain electrode having at least a portion located above the etch-stopper layer; forming a semiconductor layer patterned, by performing dry etching on the semiconductor film; and performing plasma treatment on an altered layer in a hydrogen atmosphere, the altered layer being a surface layer of the etch-stopper layer that is (i) exposed from the source electrode and the drain electrode and (ii) altered by the dry etching, the altered layer having at least a portion contacting a surface of the semiconductor layer.

According to the aspect, performing plasma treatment in a hydrogen atmosphere modifies the altered layer which includes a large amount of fixed charges and which is formed near the surface of the etch-stopper layer by dry etching. This reduces the amount of fixed charges in the altered layer. As a result, it is possible to reduce occurrence of a parasitic transistor caused due to the altered layer, which allows manufacturing of a thin-film transistor with reduced hump phenomenon.

Furthermore, in the method for manufacturing the thin-film transistor according to an aspect of the present invention, it may be that the altered layer has a density higher than a density of a portion of the etch-stopper layer which is not altered by the dry etching.

According to the aspect, the altered layer is a region having a density higher than the base of the etch-stopper layer. This allows the altered layer to be identified. Furthermore, the altered layer includes a large amount of fixed charges, which causes hump phenomenon. Hence, performing plasma treatment reduces the amount of fixed charges in the altered layer which causes the hump phenomenon, thereby reducing occurrence of the parasitic transistor.

Furthermore, in the method for manufacturing the thin-film transistor according to an aspect of the present invention, it may be that the altered layer has a thickness of at least 30 nm. Furthermore, in the method for manufacturing the thin-film transistor according to an aspect of the present invention, it may be that the altered layer has a chlorine concentration which is at least ten times higher than a chlorine concentration of the etch-stopper layer. Furthermore, in the method for manufacturing the thin-film transistor according to an aspect of the present invention, it may be that the altered layer has a carbon concentration which is at most one hundredth of a carbon concentration of the etch-stopper layer. However, the carbon concentration significantly varies depending on materials. Hence, the carbon concentration in the altered layer may exceed 1/100 of the carbon concentration in the etch-stopper layer.

With these configuration, it is possible to distinguish the etch-stopper layer serving as a protective film of the semiconductor layer from the altered layer to be modified, allowing clearly identifying the altered layer. Furthermore, the altered layer includes a large amount of fixed charges, which causes hump phenomenon. Accordingly, it is possible to effectively perform plasma treatment on the altered layer which causes the hump phenomenon, which leads to a thin-film transistor with excellent transistor characteristics.

Furthermore, in the method for manufacturing the thin-film transistor according to an aspect of the present invention, it may be that in the performing of plasma treatment on an altered layer, a parallel-plate electrode radio frequency (RF) plasma apparatus is used. In this case, it may be that in the performing of plasma treatment on an altered layer, the substrate is set to a temperature of at least 280 degrees Celsius and at most 350 degrees Celsius to generate plasma. Furthermore, it may be that in the performing of plasma treatment on an altered layer, a distance between parallel-plate electrodes of the parallel-plate electrode RF plasma apparatus is at least 500 mm and at most 600 mm.

These configurations modify the altered layer generated by dry etching, allowing the amount of fixed charges in the altered layer to be effectively reduced.

Furthermore, in the method for manufacturing the thin-film transistor according to an aspect of the present invention, the semiconductor film is a silicon film. In this case, the method may further include performing plasma treatment as a first plasma treatment on the semiconductor film in a hydrogen atmosphere, before the forming of an etch-stopper layer, wherein the performing of plasma treatment on an altered layer is performed as a second plasma treatment.

The etch-stopper layer comprising an organic material is removed by hydrogen plasma. Hence, the hydrogen plasma is consumed by the etch-stopper layer. According to the aspect, since plasma treatment is performed before the etch-stopper layer is formed, it is possible to prevent the etch-stopper layer from consuming plasma. This allows hydrogen plasma treatment to be performed effectively on the silicon film.

Furthermore, in the method for manufacturing the thin-film transistor according to an aspect of the present invention, it may be that the second plasma treatment generates plasma having an intensity lower than an intensity of plasma generated by the first plasma treatment. In this case, it may be that each of the first plasma treatment and the second plasma treatment uses a parallel-plate electrode radio frequency (RF) plasma apparatus, and a distance between parallel-plate electrodes of the parallel-plate electrode RF plasma apparatus is greater in the second plasma treatment than in the first plasma treatment.

Furthermore, in the method for manufacturing the thin-film transistor according to an aspect of the present invention, it may be that the first plasma treatment is a process in which a dangling bond of a silicon element in the silicon film is hydrogen-terminated, and the second plasma treatment is a process in which the altered layer is modified to equalize an amount of fixed charges in the altered layer and in a portion other than the altered layer in the etch-stopper layer.

Furthermore, in the method for manufacturing the thin-film transistor according to an aspect of the present invention, it may be that the semiconductor film is an oxide semiconductor film.

Furthermore, a thin-film transistor according to an aspect of the present invention includes: a gate electrode above a substrate; a gate insulating layer above the gate electrode; a semiconductor layer that is opposed to the gate electrode with the gate insulating layer therebetween; an etch-stopper layer above the semiconductor layer and comprising an organic material; and a source electrode and a drain electrode that are opposed to each other, each of the source electrode and the drain electrode having at least a portion located above the etch-stopper layer, wherein the etch-stopper layer includes a modified layer in a region which (i) is in a surface of the etch-stopper layer exposed from the source electrode and the drain electrode and (ii) has at least a portion contacting a surface of the semiconductor layer, the modified layer being an altered layer that has been modified, the altered layer being generated by alteration of a material of the etch-stopper layer.

According to the aspect, it is possible to eliminate unevenness in the amount of fixed charges in the altered layer, thereby equalizing the amount of fixed charges in the etch-stopper layer. As a result, it is possible to reduce occurrence of the parasitic transistor caused due to the altered layer. Accordingly, it is possible to reduce hump phenomenon, leading to the excellent transistor characteristics.

Furthermore, in the thin-film transistor according to an aspect of the present invention, it may be that the altered layer is a surface layer of the etch-stopper layer altered by dry etching performed to pattern the semiconductor layer.

Furthermore, in the thin-film transistor according to an aspect of the present invention, it may be that the modified layer has a thickness of at least 30 nm. Furthermore, in the thin-film transistor according to an aspect of the present invention, it may be that the modified layer has a chlorine concentration which is at least ten times higher than a chlorine concentration of the etch-stopper layer. Furthermore, in the thin-film transistor according to an aspect of the present invention, it may be that the modified layer has a carbon concentration which is at most one hundredth of a carbon concentration of the etch-stopper layer.

Embodiment

The following shall describe a thin-film transistor and a method for manufacturing the thin-film transistor according to an embodiment of the present invention with reference to the drawings. The exemplary embodiment described below shows a preferred specific example. The numerical values, shapes, materials, structural elements, the arrangement and connection of the structural elements, steps, the processing order of the steps etc. shown in the following exemplary embodiment are mere examples, and therefore do not limit the scope of the present invention. Therefore, among the structural elements in the following exemplary embodiment, structural elements not recited in any one of the independent claims are not necessarily required to achieve the object of the present invention, but are described as more preferable implementations.

Furthermore, in each of the drawings, substantially same structural elements are assigned with the same referential numerals. Note that each figure is a schematic diagram, and is not necessarily accurate.

FIG. 1 schematically shows a configuration of a thin-film transistor according to the embodiment of the present invention. In FIG. 1, (a) shows a cross-sectional view of the thin-film transistor taken along line A-A' in (b), (b) shows a perspective plan view of the thin-film transistor, and (c) shows an enlarged cross-sectional view of the thin-film transistor taken along line B-B' in (b).

As shown in FIG. 1, a thin-film transistor 10 according to this embodiment is a channel protective bottom-gate thin-film transistor, and includes: a substrate 1; a gate electrode 2 on the substrate 1; a gate insulating layer 3 on the gate electrode 2; a semiconductor layer 40 that is opposed to the gate electrode 2 with the gate insulating layer 3 therebetween; a protective layer 6 on the semiconductor layer 40; and a source electrode 8S and a drain electrode 8D each of which has at least a portion located above the protective layer 6.

The thin-film transistor 10 according to this embodiment further includes a pair of contact layers 7 and a passivation layer 9. Each of the contact layers 7 has at least a portion located on the protective layer 6, and is formed between (i) the semiconductor layer 40 and (ii) the source electrode 8S or the drain electrode 8D.

The semiconductor layer 40 is patterned into an island shape above the substrate 1, and includes stacked films of: a crystalline silicon semiconductor layer 4 serving as a first semiconductor layer that is a lower layer; and an amorphous silicon semiconductor layer 5 serving as a second semiconductor layer that is an upper layer. The semiconductor layer 40 is opposed to the gate electrode 2 with the gate insulating layer 3 therebetween.

The thin-film transistor 10 according to this embodiment is an n-channel TFT. The following shall specifically describe elements of the thin-film transistor 10 according to this embodiment.

The substrate 1 is a glass substrate comprising, for example, a glass material such as silica glass, alkali-free glass, or highly heat-resistant glass. An undercoat layer comprising silicon nitride ($SiN_x$), silicon oxide ($SiO_y$, silicon oxynitride ($SiO_yN_x$), or others may be formed on the substrate 1 in order to prevent impurities such as sodium and phosphorus in the glass substrate from entering the semiconductor layer 40. In addition, the undercoat layer also functions as a layer for buffering the heat on the substrate 1 in a high-temperature thermal treatment process such as laser annealing. The thickness of the undercoat layer is, for example, approximately 100 nm to 2000 nm.

The gate electrode 2 is formed on the substrate 1 in a predetermined shape. The gate electrode 2 has a single-layer structure or a multi-layer structure that comprises a conductive material which withstands melting-point temperature of silicon, an alloy including the materials, or the like. Examples of the materials of the gate electrode 2 include molybdenum (Mo), aluminum (Al), copper (Cu), tungsten (W), tantalum (Ta), niobium (Nb), nickel (Ni), titanium (Ti), chromium (Cr), and molybdenum-tungsten (MoW). The thickness of the gate electrode 2 is, for example, approximately 20 nm to 500 nm.

The gate insulating layer 3 (gate insulating film) is formed above the substrate 1. In this embodiment, the gate insulating layer 3 is formed on the entire surface of the substrate 1 covering the gate electrode 2. The gate insulating layer 3 may comprise, for example, silicon oxide ($SiO_y$), silicon nitride ($SiN_x$), silicon oxynitride ($SiO_yN_x$), aluminum oxide ($AlO_z$), or tantalum oxide ($TaO_w$), or may be made of a stacked film of the materials. The thickness of the gate electrode 3 is, for example, approximately 50 nm to 300 nm.

In this embodiment, the crystalline silicon semiconductor layer 4 serves as the semiconductor layer 40. Accordingly, at least silicon oxide is used for the gate insulating layer 3, for example. The reason is that it is preferable to have good interface state between the semiconductor layer 40 and the gate insulating layer 3 for maintaining excellent threshold voltage characteristics of the TFT, and silicon oxide is suitable for this purpose.

The crystalline silicon semiconductor layer 4 is a semiconductor thin film formed on the gate insulating layer 3, and is a channel layer having a predetermined channel region in which movement of carriers are controlled by the voltage applied to the gate electrode 2. The channel region refers to a region above the gate electrode 2. The length of the channel region in the charge movement direction corresponds to the gate length. The crystalline silicon semiconductor layer 4 may be formed by crystallizing amorphous silicon, for example.

The grain size of the crystalline silicon in the crystalline silicon semiconductor layer 4 is, for example, approximately 5 nm to 1000 nm. In this case, the crystalline silicon semiconductor layer 4 may comprise only polycrystalline silicon having an average grain size of 100 nm or more. Other than this, the crystalline silicon semiconductor layer 4 may have a mixed crystal structure of the polycrystalline silicon and microcrystalline silicon referred to as microcrystal having an average grain size of at least 20 nm and less than 40 nm, or a mixed crystal structure of amorphous silicon and crystalline silicon. In order to achieve excellent turn-on characteristics, at least the channel region of the crystalline silicon semiconductor layer 4 is formed of a film having a high ratio of crystalline silicon, for example. Note that, the thickness of the crystalline silicon semiconductor layer 4 is, for example, approximately 10 nm to 90 nm.

The amorphous silicon semiconductor layer 5 is a semiconductor thin film formed on the crystalline silicon semiconductor layer 4, and is, for example, an intrinsic amorphous silicon film. Note that, the thickness of the amorphous silicon semiconductor layer 5 is, for example, approximately 10 nm to 60 nm.

The semiconductor layer 40 according to this embodiment has a stacked structure of the crystalline silicon semiconductor layer 4 and the amorphous silicon semiconductor layer 5, but the present invention is not limited to the example. The semiconductor layer 40 may include only a silicon semiconductor layer made of the crystalline silicon semiconductor layer or the amorphous silicon semiconductor layer. Furthermore, examples of the semiconductor layer 40 include a metal oxide semiconductor layer and an organic semiconductor layer, other than the silicon semiconductor layer.

The protective layer 6 is an etch-stopper layer formed on the semiconductor layer 40, and is a channel protective film for protecting the semiconductor layer 40 that is to be a channel layer. More specifically, the protective layer 6 functions as a channel etch-stopper (CES) layer for preventing the channel region of the semiconductor layer 40 from being etched during the etching process for patterning the pair of the contact layer 7 and the semiconductor layer 40. The protective layer 6 according to this embodiment is formed on the amorphous silicon semiconductor layer 5. In this embodiment, the thickness of the protective layer 6 in the region overlapping with the source electrode 8S or the drain electrode 8D is, for example, 300 nm to 1 μm. Furthermore, the thickness of the protective layer 6 is at least 500 nm and at most 1 μm, for example. The lower limit of the thickness of the protective layer 6 is determined in consideration for margin due to etching and reduction in effect of fixed charges in the protective layer 6. The upper limit of the thickness of the protective layer 6 is determined in consideration for suppressing a decrease in process reliability due to discontinuity of the contact layer 7 or the like caused by an increase in the level difference between the protective layer 6 and the amorphous silicon semiconductor layer 5.

The protective layer 6 comprises silicon (Si) and oxygen (O) as major components. The protective layer 6 according to this embodiment is an organic material film mainly comprises organic materials including silicon, oxygen, and carbon (c). In this case, the protective layer 6 may comprise, for example, polysiloxane. Polysiloxane has silica bonding as a main chain to which organic components having carbon such as methyl are combined. The protective layer 6 may be formed by applying an organic application material by the spin coating or others. Other than the application method such as the spin coating, the protective layer 6 may be formed by a droplet discharging method or a printing method, such as the screen printing or the offset printing, which allows formation of a predetermined pattern.

The protective layer 6 having such a configuration includes a non-altered layer 61 and a modified layer 62 that is a modified altered layer. The non-altered layer 61 is the protective layer 6 that has not been altered by dry etching performed to pattern the semiconductor layer 40. On the other hand, the modified layer 62 is a layer obtained by an altered layer modified by plasma treatment. The altered layer is a surface layer of the protective layer 6 altered by the dry etching performed to pattern the semiconductor layer 40. The altered layer that is to be modified as the modified layer 62 is generated in a surface region of the protective layer 6 exposed from the source electrode 8S and the drain electrode 8D. The surface region includes at least a portion contacting the surface of the semiconductor layer 40. In (b) in FIG. 1, the non-altered layer 61 is visible, but normally, the non-altered layer 61 is covered with the modified layer 62, which makes the non-altered layer 61 invisible. In (b) in FIG. 1, the non-altered layer 61 is shown for convenience. The same also applies below.

The protective layer 6 has insulation properties. The pair of contact layers 7 is not electrically connected to each other.

The pair of contact layers 7 is formed of amorphous semiconductor layers having a high concentration of impurities or polycrystalline semiconductor layers having a high concentration of impurities. The pair of contact layers 7 may be, for example, n-type semiconductor layers formed by doping phosphorous (P) in the amorphous silicon as n-type impurity, and be n+ layers including a high concentration of impurities of at least $1\times10^{19}$ [atm/cm$^3$].

The pair of contact layers 7 is opposed to each other at a predetermined distance on the protective layer 6. Each of the contact layers 7 is formed from the upper surface of the protective layer 6 covering the amorphous silicon semiconductor layer 5. The thickness of each of the contact layers 7 may be 5 nm to 100 nm, for example.

The pair of contact layers 7 according to this embodiment is formed between (i) the amorphous silicon semiconductor layer 5 and (ii) the source electrode 8S and the drain electrode 8D, but is not formed on the lateral side of the semiconductor layer 40 (the lateral side of the amorphous silicon semiconductor layer 5 and the lateral side of the crystalline silicon semiconductor layer 4). More specifically, the pair of contact layers 7 is flush with the semiconductor layer 40 (the amorphous silicon semiconductor layer 5 and the crystalline silicon semiconductor layer 4).

The pair of contact layers 7 has a single layer structure, but may include two layers of a low-concentration field relief layer (n− layer) serving as the lower layer and a high-concentration contact layer (n+ layer) serving as the upper layer. In this case, for example, the low-concentration field relief layer is formed by doping phosphorous (P) of approximately $1\times10^{17}$ [atm/cm$^3$].

A pair of the source electrode 8S and the drain electrode 8D are opposed to each other at a predetermined distance, and is formed on the pair of contact layers 7, flush with the contact layers 7.

The source electrode 8S covers one of the ends of the protective layer 6 and the semiconductor layer 40 (the amorphous silicon semiconductor layer 5) via one of the contact layers 7. On the other hand, the drain electrode 8D covers the other end of the protective layer 6 and the semiconductor layer 40 (the amorphous silicon semiconductor layer 5) via the other contact layer 7.

In this embodiment, each of the source electrode 8S and the drain electrode 8D may has a single-layer structure or multi-layer structure comprising a conductive material, an alloy including the materials, or the like. Examples of the materials of the source electrode 8S and the drain electrode 8D include aluminum (Al), molybdenum (Mo), tungsten (W), copper (Cu), titanium (Ti), and chromium (Cr). In this embodiment, the source electrode 8S and the drain electrode 8D have a try-layer structure of MoW/Al/MoW. The thickness of the source electrode 8S and the drain electrode 8D may be, for example, approximately 100 nm to 500 nm.

The passivation layer 9 is formed to cover the source electrode 8S, the drain electrode 8D, and the protective layer 6 exposed between the source electrode 8S and the drain electrode 8D. The thickness of the passivation layer 9 may be, for example, at least 20 nm and at most 1000 nm.

The passivation layer 9 comprises major components identical to those of the protective layer 6. In this embodiment, since the protective layer 6 comprises silicon and oxygen as major components, the passivation layer 9 also comprises silicon and oxygen as major components. While the protective layer 6 comprises organic materials, the passivation layer 9 comprises inorganic materials. For example, the passivation layer 9 may comprise silicon oxide. Instead, the passivation layer 9 may comprise silicon nitride. The passivation layer 9 is used, for example, in order to prevent impurities such as oxygen and water outside from entering the semiconductor layer materials composing the thin-film transistor 10.

Figure 2:
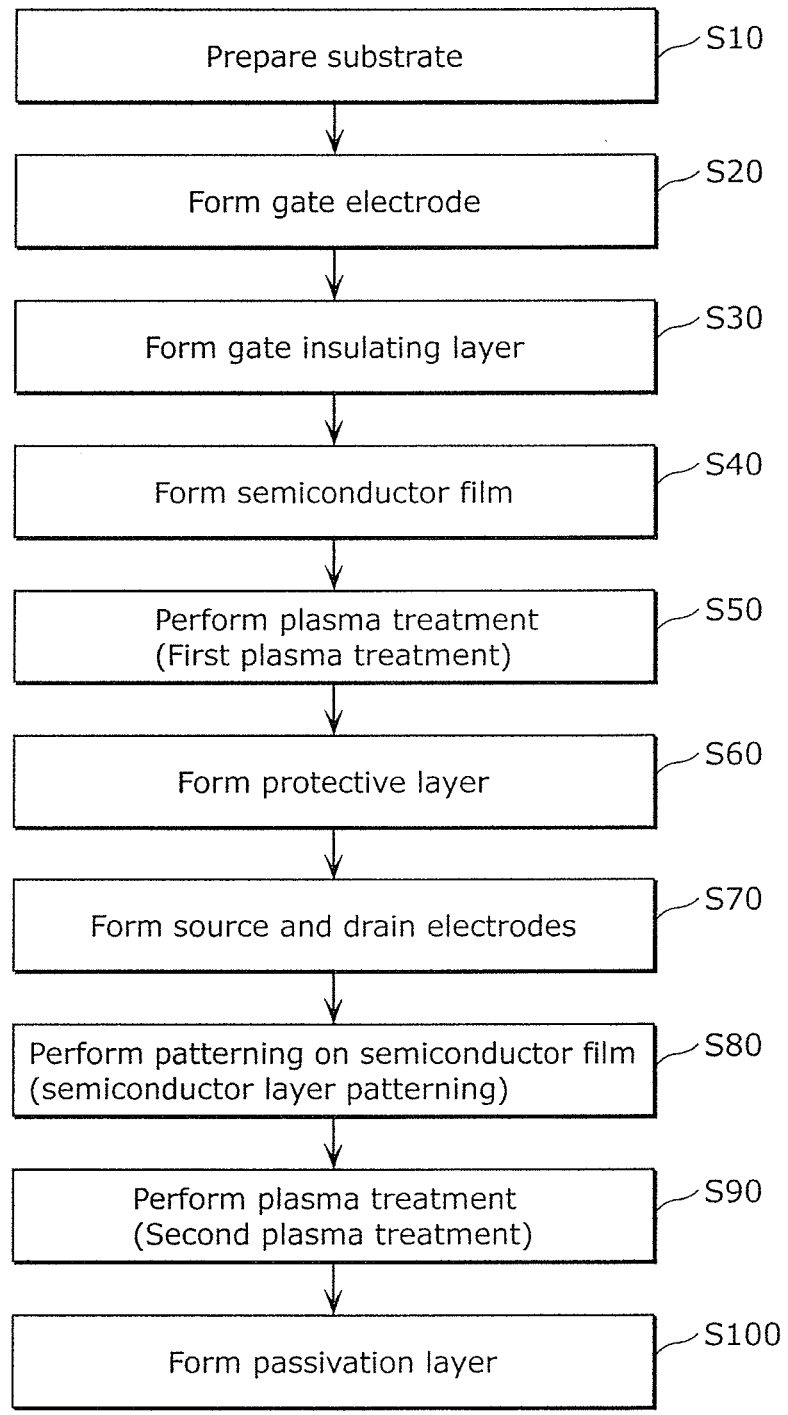
FIG. 2 is a flowchart of a method for manufacturing the thin-film transistor according to the embodiment of the present invention.

Next, the following shall describe a method for manufacturing the thin-film transistor 10 according to the embodiment with reference to FIG. 2 and FIGS. 3A to 3M. FIG. 2 is a flowchart of a method for manufacturing the thin-film transistor according to the embodiment of the present invention. FIGS. 3A to 3M schematically illustrate respective processes in the method for manufacturing the thin-film transistor according to the embodiment of the present invention. In each of FIGS. 3A to 3M, (a) shows a cross sectional view of the thin-film transistor taken along line A-A' in (b), and (b) shows a plan view of the thin-film transistor. To facilitate understanding, the same hatching is used for the same constituent elements in each of the plan views and cross-sectional views.

As shown in FIG. 2, the method for manufacturing the thin-film transistor 10 according to this embodiment includes: preparing the substrate 1 (S10); forming the gate electrode 2 (S20); forming the gate insulating layer 3 (S30); forming the semiconductor film 40F (S40); forming the protective layer 6 (etch-stopper layer) (S60); forming the source electrode 8S and the drain electrode 8D (S70); patterning the semiconductor film 40F into a predetermined shape by dry etching (S80); performing plasma treatment to modify the altered layer 6a which is a layer generated by alteration of a portion of the protective layer 6 (S90). In this embodiment, other than the hydrogen plasma treatment for modifying the altered layer, the method further includes: performing plasma treatment before forming the protective layer (S50); and forming the passivation layer 9 after performing the plasma treatment for modifying the altered layer (S100). The semiconductor formation (S40) according to this embodiment includes: forming a first semiconductor film; and forming a second semiconductor film. Hereinafter, detailed descriptions are given of each process in the manufacturing method according to this embodiment.

Figure 3A:
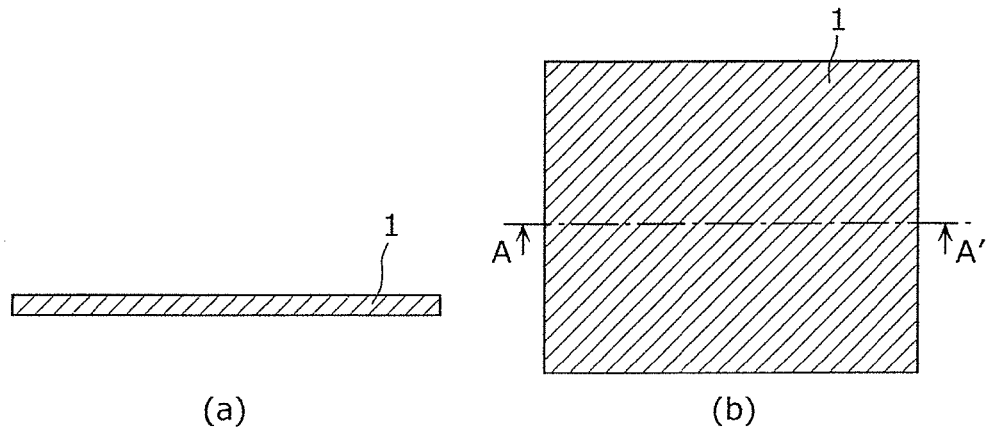
FIG. 3A shows a cross-sectional view and a plan view schematically illustrating a substrate preparation in the method for manufacturing the thin-film transistor according to the embodiment of the present invention.

First, as shown in FIG. 3A, the substrate 1 is prepared (substrate preparation). As the substrate 1, a glass substrate is prepared, for example. Before forming the gate electrode 2, an undercoat layer may be formed on the substrate 1 by the plasma chemical vapor deposition (CVD) or others. Furthermore, the process of preparing the substrate 1 also includes cleaning the substrate 1, for example, other than forming the undercoat layer.

Figure 3B:
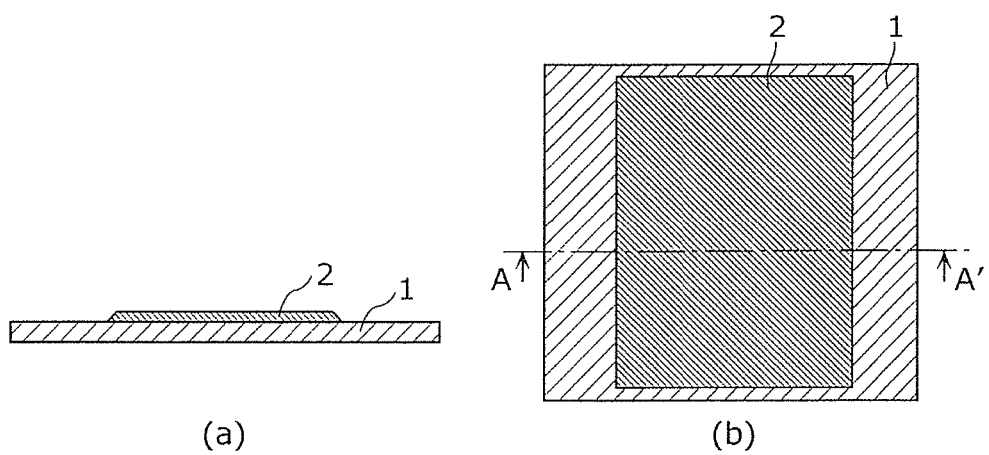
FIG. 3B shows a cross-sectional view and a plan view schematically illustrating a gate electrode formation in the method for manufacturing the thin-film transistor according to the embodiment of the present invention.

Next, as shown in FIG. 3B, the gate electrode 2 in a predetermined shape is formed above the substrate 1 by patterning (gate electrode forming process). For example, the gate electrodes 2 in a rectangular shape is formed by forming a gate metal film comprising molybdenum-tungsten (MoW) or the like on the entire surface above the substrate 1 through sputtering, and by patterning the gate metal film using the photolithography and the wet etching.

Figure 3C:
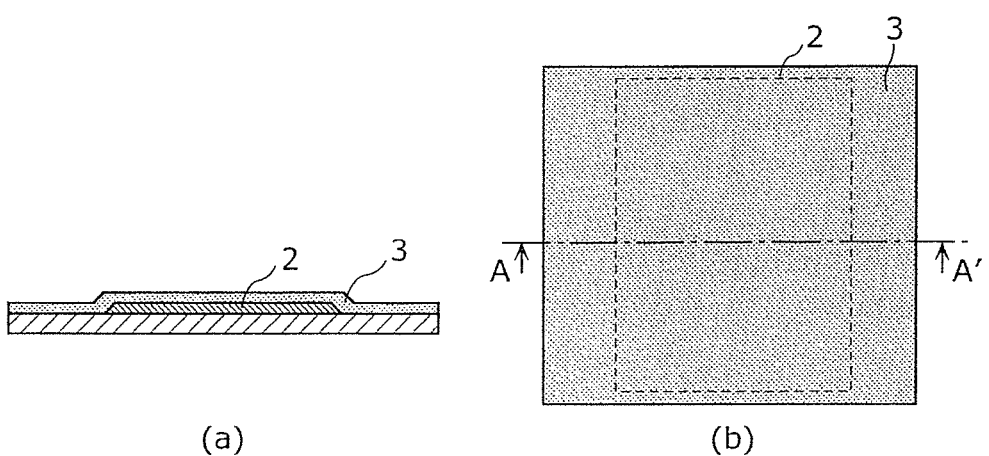
FIG. 3C shows a cross-sectional view and a plan view schematically illustrating a gate insulating layer formation in the method for manufacturing the thin-film transistor according to the embodiment of the present invention.

Next, as shown in FIG. 3C, the gate insulating layer 3 is formed above the substrate 1 (gate insulating layer forming process). For example, the gate insulating layer 3 is formed, by the plasma CVD or others, over the entire upper surface of the substrate 1 covering the gate electrode 2. In this embodiment, the gate insulating layer 3 is formed which has a two-layer structure of a silicon oxide film and a silicon nitride film.

Figure 3D:
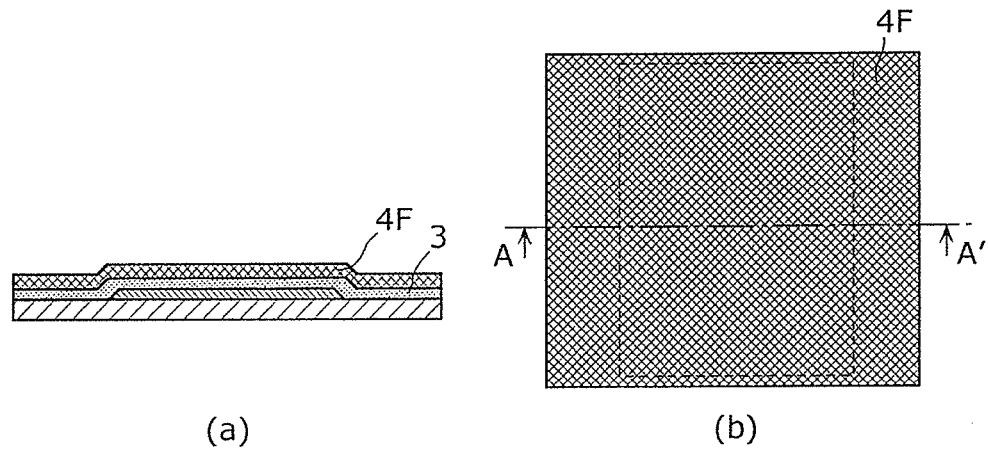
FIG. 3D shows a cross-sectional view and a plan view schematically illustrating a crystalline silicon semiconductor layer formation in the method for manufacturing the thin-film transistor according to the embodiment of the present invention.

Next, as shown in FIG. 3D, the crystalline silicon semiconductor film 4F is formed on the gate insulating layer 3, as the first semiconductor film (first semiconductor film formation). In this case, first, an amorphous silicon thin film made of an amorphous silicon film, for example, is formed on the gate insulating layer 3 by the plasma CVD or others. The amorphous silicon film can be formed under a predetermined film-forming condition, by introducing silane gas ($SiH_4$) and hydrogen gas ($H_2$) in a predetermined ratio of concentration, for example. Subsequently, a dehydrogenation annealing is performed, and the amorphous silicon thin film is annealed in the predetermined temperature so as to crystallize the amorphous silicon thin film. With this, the crystalline silicon semiconductor film 4F is formed on the gate insulating layer 3.

Note that, in this embodiment, the amorphous silicon thin film is crystallized by the laser annealing, which involves irradiating the amorphous silicon thin-film with a laser beam. Examples of the laser annealing includes laser annealing using an excimer laser (ELA) with wavelength of 190 nm to 350 nm approximately, laser annealing using a pulse laser with wavelength of 370 nm to 900 nm approximately, and laser annealing using a continuous wave laser (CW laser) with wavelength of 370 nm to 900 nm approximately. Other than the laser annealing, the amorphous silicon thin film may be crystallized by the rapid thermal processing (RTP) or rapid thermal annealing (RTA). Instead of forming the crystalline silicon semiconductor film by crystallizing the amorphous silicon thin film, the crystalline silicon semiconductor film 4F may be formed by directly growing crystals by the CVD.

Figure 3E:
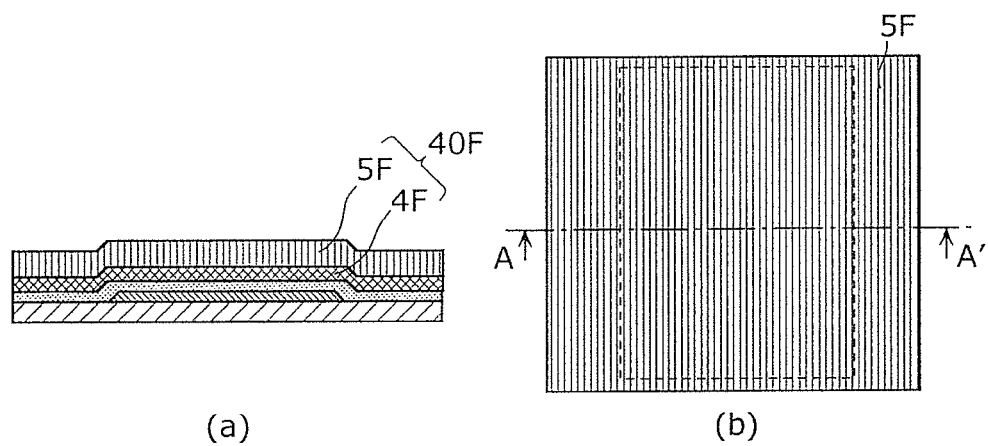
FIG. 3E shows a cross-sectional view and a plan view schematically illustrating an amorphous silicon semiconductor layer formation in the method for manufacturing the thin-film transistor according to the embodiment of the present invention.

Next, as shown in FIG. 3E, an amorphous silicon semiconductor film 5F is formed on the crystalline silicon semiconductor layer 4F, as a second semiconductor film (second semiconductor film formation). For example, an amorphous silicon film may be formed as the amorphous silicon semiconductor film 5F. The amorphous silicon film can be formed in a predetermined film-forming condition by the plasma CVD or others, using source gas including silane gas ($SiH_4$), disilane gas ($Si_2H_6$), or trisilane gas ($Si_3H_8$). As an inert gas introduced with the source gas, other than the hydrogen gas ($H_2$), argon gas (Ar) or helium gas (He) may be introduced in a predetermined ratio of concentration to form the amorphous silicon film.

With this, the semiconductor film 40F, which is stacked films of the crystalline silicon semiconductor layer 4F and the amorphous silicon semiconductor film 5F, is formed on the gate insulating layer 3.

Figure 3F:
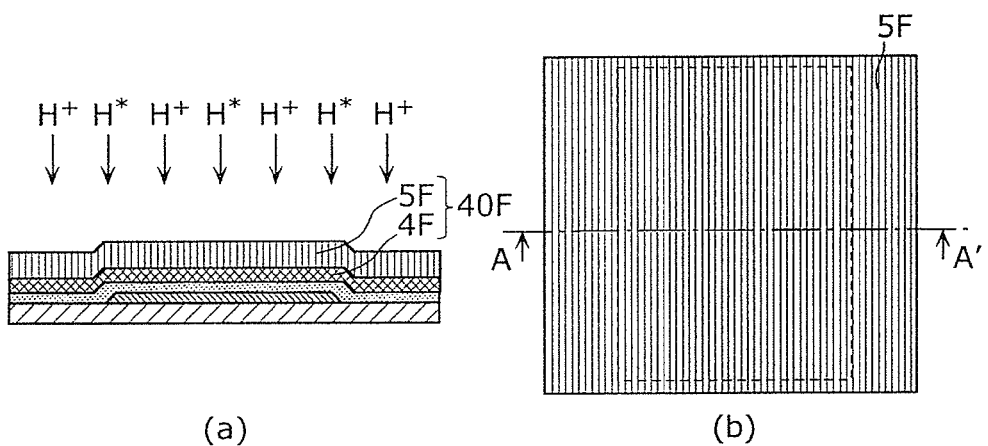
FIG. 3F shows a cross-sectional view and a plan view schematically illustrating a first plasma treatment in the method for manufacturing the thin-film transistor according to the embodiment of the present invention.

Next, as shown in FIG. 3F, first plasma treatment is performed on the semiconductor film 40F in a hydrogen atmosphere (first plasma treatment). The first plasma treatment is performed, for example, by generating hydrogen plasma by radio-frequency (RF) power from gas including hydrogen gas such as $H_2$ or $H_2$/Argon (Ar), and irradiating the semiconductor film 40F with the hydrogen plasma. The hydrogen plasma treatment produces, in the plasma atmosphere, hydrogen plasma including hydrogen ion ($H^+$) and hydrogen radical ($H^*$). Entry of the generated hydrogen ion and hydrogen radical into the crystalline silicon semiconductor film 4F causes hydrogen termination of dangling-bond (defect) of silicon atoms included in the crystalline silicon semiconductor film 4F. More specifically, dangling-bond of silicon atoms is combined with hydrogen. This reduces crystallinity defect density of the crystalline silicon semiconductor film 4F, thereby improving crystallinity of the crystalline silicon semiconductor film 4F.

By causing hydrogen termination of dangling-bond in the crystalline silicon semiconductor film 4F, it is possible to reduce carrier trap in the dangling bond, thereby improving the turn-on/off characteristics of the thin-film transistor.

In this embodiment, the first plasma treatment is performed with use of a parallel-plate electrode radio frequency (RF) plasma CVD apparatus. In this case, for example, hydrogen plasma is generated under the conditions that the temperature of the substrate 1 provided within the apparatus is 280 degrees Celsius, hydrogen ($H_2$) gas in the flow rate of 200 sccm is introduced to the apparatus as a source gas, the pressure within the apparatus is 400 Pa, the distance between the parallel-plate electrodes is 500 mm, and the RF power density applied to the parallel-plate electrodes is 125 W.

Figure 3G:
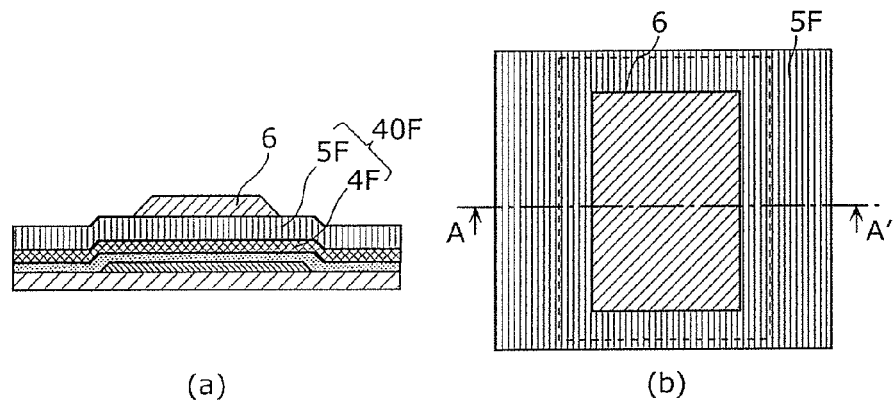
FIG. 3G shows a cross-sectional view and a plan view schematically illustrating a protective layer formation in the method for manufacturing the thin-film transistor according to the embodiment of the present invention.

Next, as shown in FIG. 3G, the protective layer 6 to be an etch-stopper layer is formed on the semiconductor film 40F (protective layer formation). For example, the protective layer 6 made of an organic protective film is formed by applying a predetermined organic material on the semiconductor film 40F by a predetermined application method and baking the organic material.

In this embodiment, an organic material comprising polysiloxane is applied to the amorphous silicon semiconductor film 5F first, and the spin coating is applied. With this, the protective layer 6 is formed on the entire surface of the amorphous silicon semiconductor film 5F. Subsequently, the protective layer 6 is pre-baked. After that, the protective film 6 in the predetermined shape is formed by exposure and development using a photo mask. After that, post-baking on the protective layer 6 is performed. With this, the protective layer 6 in the predetermined shape is formed.

Figure 3H:
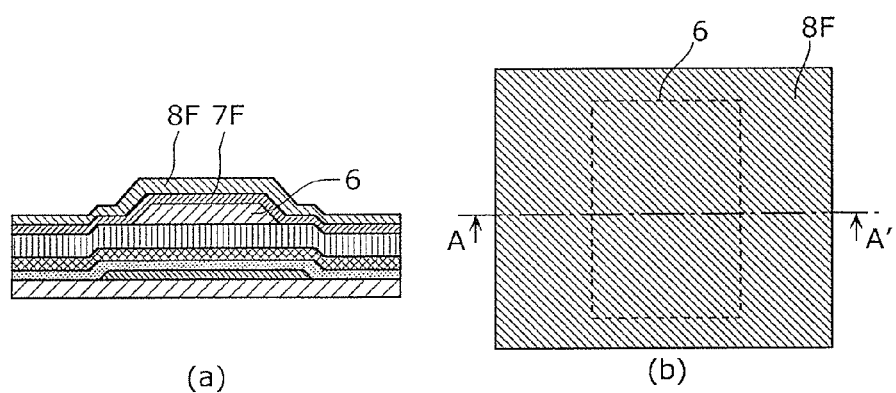
FIG. 3H shows a cross-sectional view and a plan view schematically illustrating a contact layer film formation and a source/drain metal film formation in the method for manufacturing the thin-film transistor according to the embodiment of the present invention.

Next, as shown in FIG. 3H, a contact layer film 7F is formed on the semiconductor film 40F (the amorphous silicon semiconductor film 5F) so as to cover the protective layer 6 (contact layer film formation). For example, the contact layer film 7F comprising amorphous silicon doped with an impurity of pentavalent element such as phosphorous is formed by the plasma CVD.

Next, as shown in FIG. 3G, a source-drain metal film 8F for forming the source electrode 8S and the drain electrode 8D is formed on the contract layer film 7F. For example, the source-drain metal film 8F with a try-layer structure of MoW/Al/MoW is formed by sputtering (source-drain metal film formation).

Figure 3I:
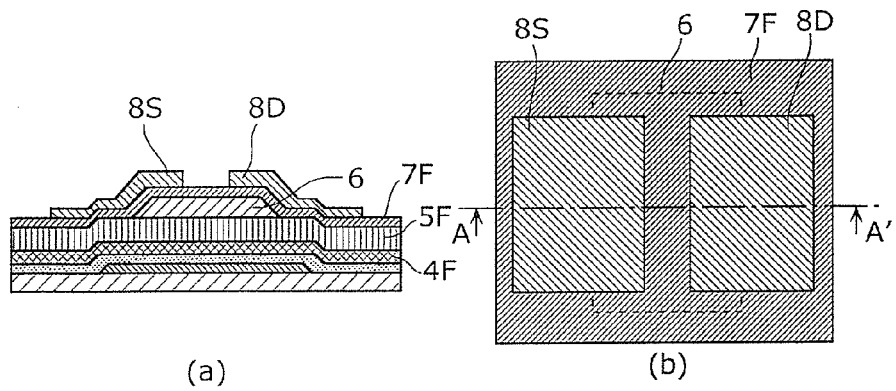
FIG. 3I shows a cross-sectional view and a plan view schematically illustrating a source/drain metal film patterning in the method for manufacturing the thin-film transistor according to the embodiment of the present invention.

Next, as shown in FIG. 3I, a pair of the source electrode 8S and the drain electrode 8D is formed on the amorphous silicon semiconductor film 5F, interposing the protective layer 6, by patterning the source-drain metal film 8F. More specifically, a resist is applied on the source-drain metal film 8F for patterning the source-drain metal film 8F into the predetermined shape, and exposure and development is performed to pattern the resist into a shape corresponding to the shape of the source electrode 8S and the drain electrode 8D. Next, the source-drain metal film 8F is pattern by performing etching such as wet etching using the resist as a mask. With this, as shown in FIG. 3I, the pair of the source electrode 8S and the drain electrode 8D which are separated and in the predetermined shape are formed. Here, note that the contact layer film 7F functions as an etch-stopper.

Figure 3J:
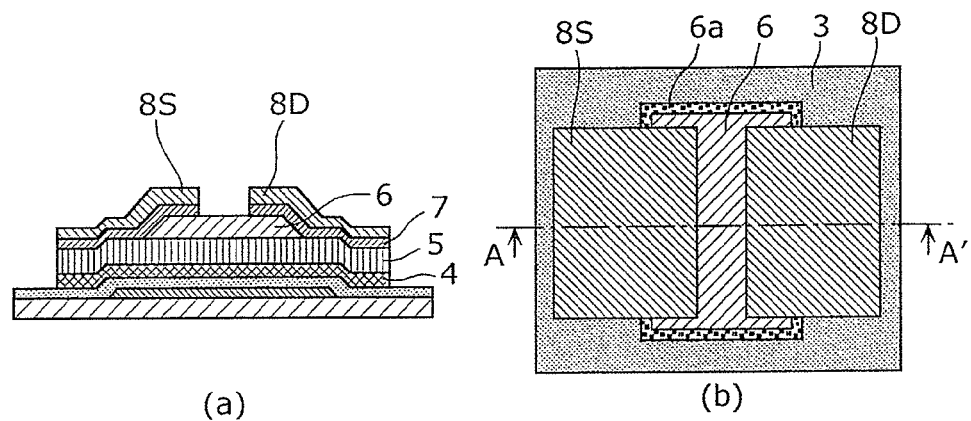
FIG. 3J shows a cross-sectional view and a plan view schematically illustrating a contact layer film patterning and a semiconductor layer patterning in the method for manufacturing the thin-film transistor according to the embodiment of the present invention.

Subsequently, the resist on the source electrode 8S and the drain electrode 8D is removed, and etching, such as dry etching, is performed using the source electrode 8S and the drain electrode 8D as masks so as to pattern the contract layer film 7F. At the same time, the semiconductor film 40F (the amorphous silicon semiconductor film 5F and the crystalline silicon semiconductor film 4F) is patterned into an island shape (semiconductor film patterning). Accordingly, as shown in FIG. 3J, the pair of contact layers 7 in the predetermined shape is formed, and the amorphous silicon semiconductor layer 5 and the crystalline silicon semiconductor layer 4 patterned into the island shape are formed. Here, note that the protective layer 6 functions as an etch-stopper layer.

In this embodiment, the semiconductor film 40F is patterned by a dry etching apparatus in the etching conditions that the etching gas is $Cl_2$ gas, the pressure is 2 Pa, and inductive coupled plasma (ICP) power is 300 W. In this embodiment, dry etching is performed on the semiconductor film 40F after removing the resist on the source electrode 8S and the drain electrode 8D; however, dry etching may be performed without removing the resist.

In such a case, as shown in (b) in FIG. 3J, dry etching performed when patterning the semiconductor film 40F generates the altered layer 6a near the surface of the protective layer 6 in the region of the protective layer 6 exposed from the source electrode 8S and the drain electrode 8D. More specifically, the altered layer 6a is generated by the surface layer of the protective layer 6 exposed from the source electrode 8S and the drain electrode 8D being altered by the etching gas used in the dry etching. Furthermore, as shown in FIG. 3J, the altered layer 6a appears particularly at the lateral sides of the exposed protective layer 6. As described above, the protective layer 6 obtained after performing dry etching on the semiconductor film 40F includes: the altered layer 6a which is a portion, of the protective layer 6, altered by the dry etching and which includes at least a portion contacting the surface of the semiconductor layer 40F; and a bulk layer which is a portion of the protective layer 6 not altered by the dry etching.

Figure 3K:
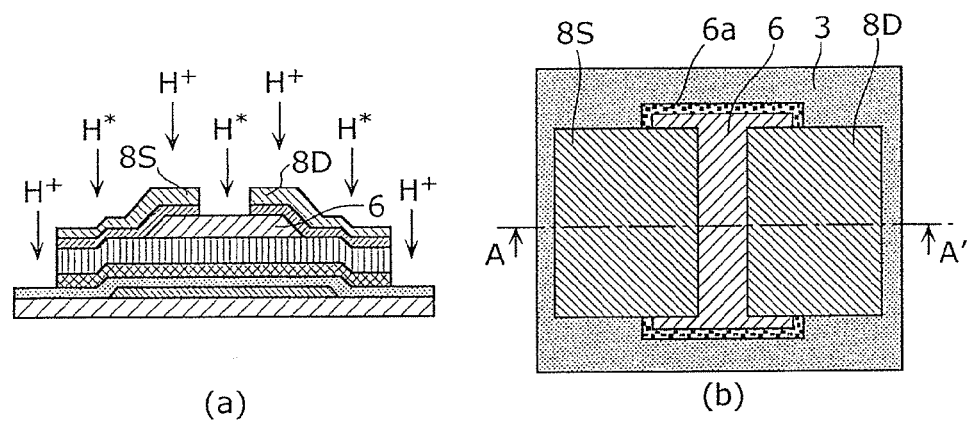
FIG. 3K shows a cross-sectional view and a plan view schematically illustrating a second plasma treatment in the method for manufacturing the thin-film transistor according to the embodiment of the present invention.

Next, as shown in FIG. 3K, second plasma treatment is performed in a hydrogen atmosphere to modify the altered layer 6a generated at the time of dry etching (second plasma treatment). The second plasma treatment is surface treatment performed on the altered layer 6a. In the second plasma treatment, the altered layer 6a is modified to equalize the amount of fixed charges in the altered layer 6a and in a portion other than the altered layer 6a. The second plasma treatment is performed, for example, by generating hydrogen plasma by radio-frequency (RF) power from gas including hydrogen gas such as $H_2$ or $H_2$/Argon (Ar), and irradiating the protective layer 6 (the altered layer 6a) with the hydrogen plasma.

In this embodiment, the second plasma treatment is performed with use of a parallel-plate electrode radio frequency (RF) plasma CVD apparatus. In this case, for example, hydrogen plasma is generated under the conditions that the temperature (growth temperature) of the substrate 1 provided within the apparatus is 280 degrees Celsius, hydrogen ($H_2$) gas in the flow rate of 200 sccm is introduced to the apparatus as a source gas, the pressure within the apparatus is 400 Pa, the distance between the parallel-plate electrodes is 600 mm, and the RF power density applied to the parallel-plate electrodes is 125 W.

Figure 3L:
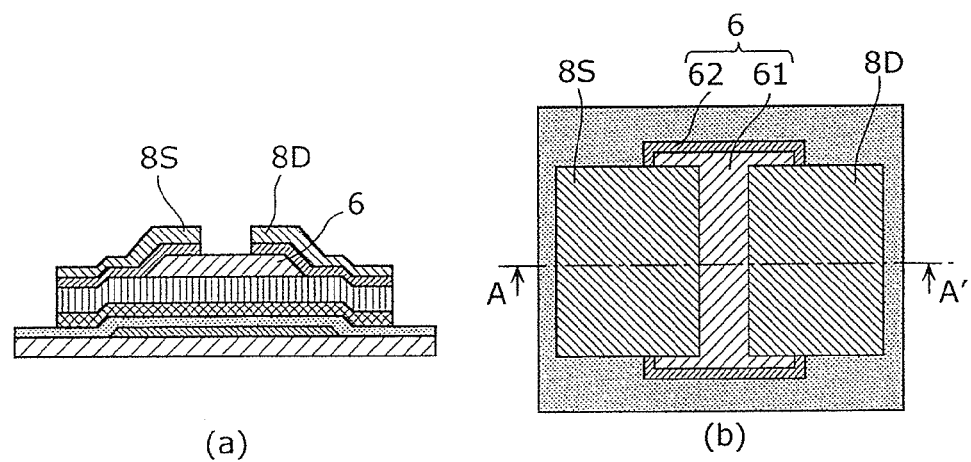
FIG. 3L shows a cross-sectional view and a plan view schematically illustrating a state after the second plasma treatment is performed in the method for manufacturing the thin-film transistor according to the embodiment of the present invention.

As shown in (b) in FIG. 3L, the above plasma treatment causes the protective layer 6 to include: the non-altered layer 61 that is a portion of the protective layer 6 not altered by dry etching; and the modified layer 62 that is a modified layer of the altered layer 6a altered by the dry etching.

Furthermore, the intensity of plasma generated in the second plasma treatment may be lower than that of plasma generated in the first plasma treatment. In this embodiment, the plasma intensity in the second plasma treatment is reduced by making the distance between the parallel-plate electrodes in the second plasma treatment longer than that in the first plasma treatment.

Figure 3M:
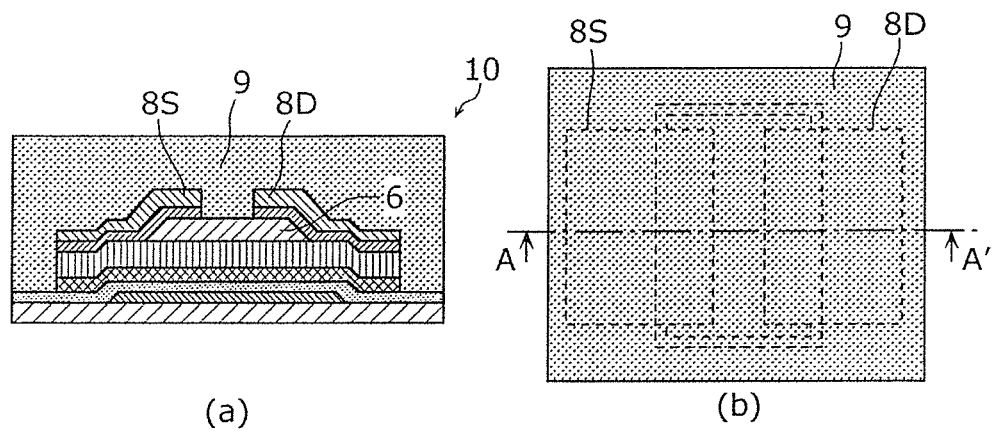
FIG. 3M shows a cross-sectional view and a plan view schematically illustrating a passivation layer formation in the method for manufacturing the thin-film transistor according to the embodiment of the present invention.

Lastly, as shown in FIG. 3M, the passivation layer 9 is formed (passivation layer formation). In this embodiment, the passivation layer 9 is formed so as to cover all of the exposed components (the source electrode 8S, the drain electrode 8D, the protective layer 6, and the amorphous silicon semiconductor layer 5).

For example, the passivation layer 9 comprises a material having a major component identical to that of the protective layer 6. In this embodiment, the passivation layer 9 comprising silicon oxide ($SiO_x$) is formed by the plasma CVD.

The thin-film transistor 10 according to this embodiment is manufactured as described above.

Next, detailed descriptions are given of the functions and effects of the thin-film transistor 10 according to this embodiment, including how the present invention was achieved.

Figure 4:
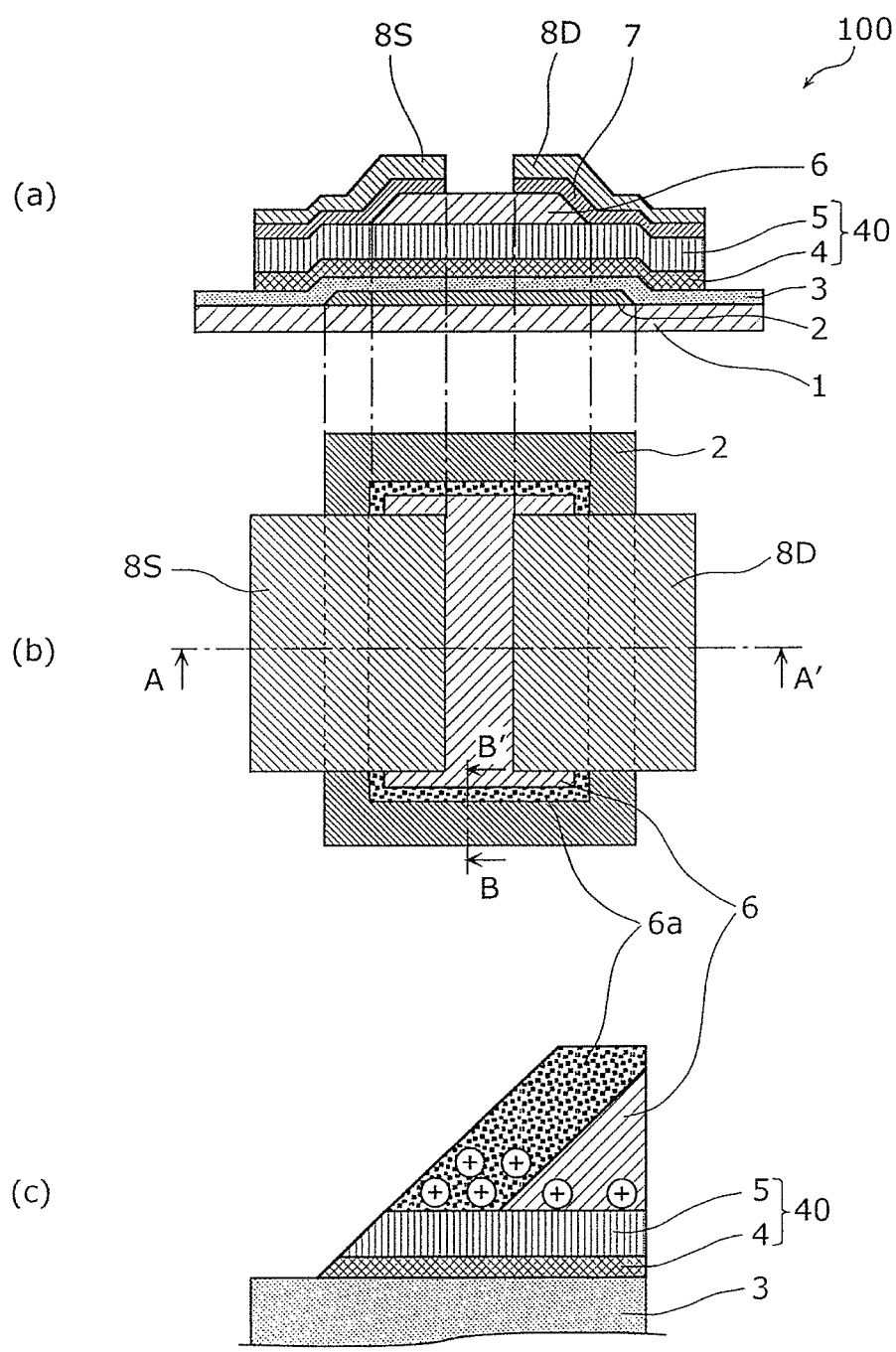
FIG. 4 schematically shows a configuration of a conventional thin-film transistor.
Figure 5A:
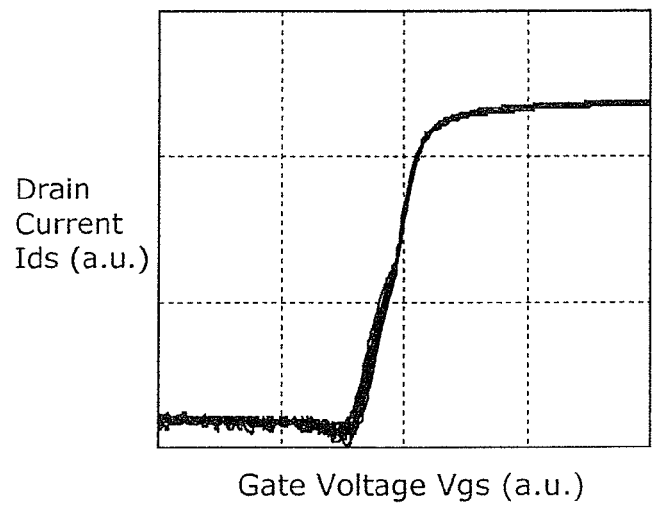
FIG. 5A shows current-voltage characteristics of the conventional thin-film transistor.
Figure 5B:
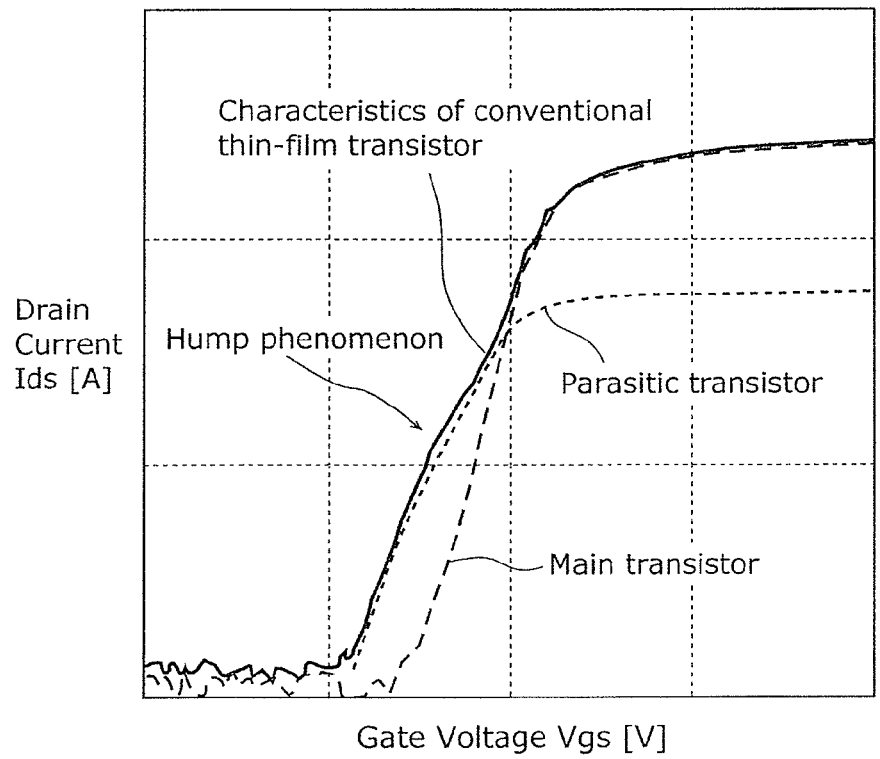
FIG. 5B shows hump phenomenon in the current-voltage characteristics of the conventional thin-film transistor.

FIG. 4 schematically shows a configuration of a conventional thin-film transistor. In FIG. 4, (a) shows a cross-sectional view of the thin-film transistor taken along line A-A' in (b), (b) shows a perspective plan view of the thin-film transistor, and (c) shows an enlarged cross-sectional view of the thin-film transistor taken along line B-B' in (b). FIG. 5A and FIG. 5B show current-voltage characteristics (Ids-Vgs characteristics) of the conventional thin-film transistor.

As shown in (a) in FIG. 4, the conventional thin-film transistor 100 includes, above the substrate 1, the gate electrode 2, the gate insulating layer 3, the crystalline silicon semiconductor layer 4, the amorphous silicon semiconductor layer 5, the protective layer 6, the pair of contact layers 7, the source electrode 8S, and the drain electrode 8D.

The conventional thin-film transistor 100 including an etch-stopper layer (protective layer 6) comprising organic application materials has a problem in that it is difficult to obtain desired transistor characteristics (current-voltage characteristics). The current-voltage characteristics of the thin-film transistor 100 were measured. The result shows, as shown in FIG. 5A, that a hump, referred to as hump phenomenon, is included in the range where current rapidly increases.

Here, referring to FIG. 5B, a description is given of the hump phenomenon. The hump phenomenon is considered to be caused due to presence of a parasitic transistor other than the main transistor in a single thin-film transistor, as shown in FIG. 5B. The hump phenomenon refers to a phenomenon in which an unnatural hump is included in the current-voltage characteristics of the single thin-film transistor 100 by the current-voltage characteristics of the main transistor being combined with the current-voltage characteristics of the parasitic transistor. Note that in this Description, the organic application materials refer to materials comprising organic materials including carbon, and refers to materials that can be formed by printing process, such as inkjet printing, or application process, such as spin coating.

After diligent analysis and consideration on the cause of the hump phenomenon, the inventors found out the following causes. In the case where an organic application material is used for the etch-stopper layer (protective layer), the exposed etch-stopper layer is damaged when patterning the semiconductor film into a predetermined shape (an island shape). This generates, in the surface of the etch-stopper layer, an altered layer which is generated by alteration of the organic coating material that is a base material of the etch-stopper layer. The inventors also found out that the thickness of the etch-stopper layer decreases at the exposed outer peripheral portion of the etch-stopper layer due to etching. The above finding shows that the parasitic transistor is formed by the newly generated altered layer contacting the semiconductor layer, thereby causing the hump phenomenon.

Figure 6:
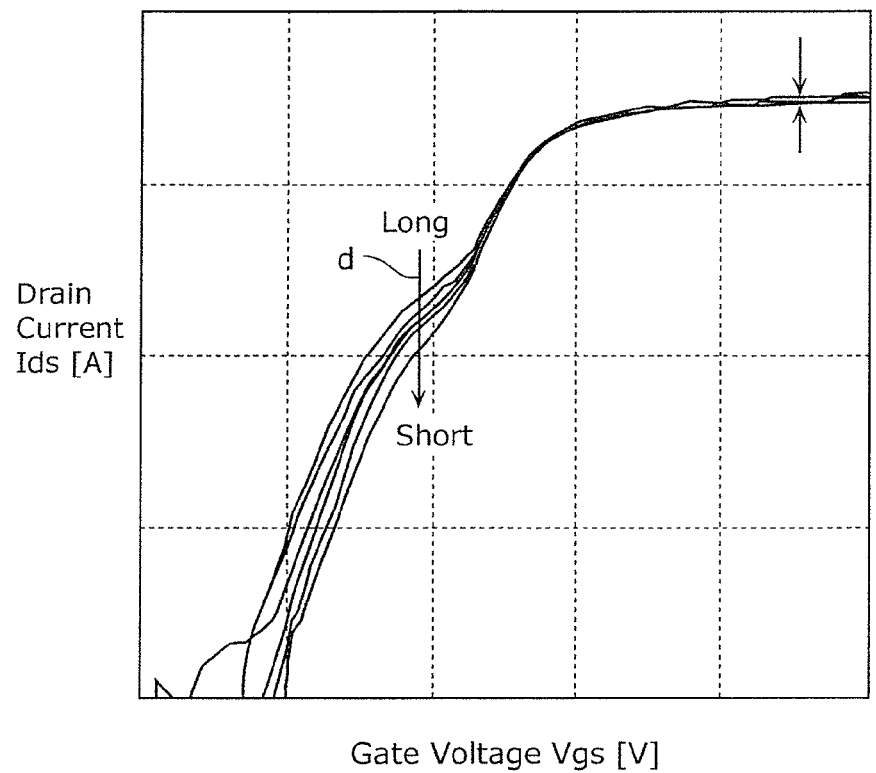
FIG. 6 is a diagram showing respective current-voltage characteristics of the conventional thin-film transistor shown in FIG. 4 obtained when the protective layer and the altered layer protrude, by different length, from the source electrode (drain electrode) in the gate width direction.

Referring to FIG. 6, more detailed descriptions will be given of occurrence of the parasitic transistor. FIG. 6 is a diagram showing respective current-voltage characteristics of the conventional thin-film transistor shown in FIG. 4 obtained when the protective layer 6 protrude, by different length (d), from the source electrode (drain electrode) in the gate width direction.

As shown in FIG. 6, in the current-voltage characteristics of respective thin-film transistors having different protruding length d, saturated current values of the main transistor do not vary, but the saturated current values of the parasitic transistor vary depending on the protruding length d. More specifically, as the protruding length d increases, the saturated current value of the parasitic transistor decreases. This shows that the portion which causes the parasitic transistor, that is, the altered layer 6a is present at the outer peripheral edge portion of the protective layer 6.

Now, referring back to (c) in FIG. 4, detailed descriptions are given of occurrence of the hump phenomenon due to the altered layer 6a. In FIG. 4, (c) shows a cross-sectional view of the neighboring portions of the outer peripheral edge of the protective layer (etch-stopper layer) of the conventional thin-film transistor 100, and schematically shows the amount of fixed charges at the back channel side of the semiconductor layer.

Normally, the entire surface of the semiconductor layer 40 at the back channel side is covered with the protective layer 6 which has uniform composition of elements and a uniform concentration of the composition of the elements, and the amount of fixed charges at the back channel side is uniform within a surface of the substrate. More specifically, in such a case, hump phenomenon does not occur in the current-voltage characteristics of the thin-film transistor.

However, as described above, in the case where the organic application material is used as the material for the protective layer 6, dry etching performed to pattern the semiconductor layer 40 alters the organic application material in the protective layer 6, thereby forming the altered layer 6a. In addition, since etching is performed while the lateral side of the semiconductor layer 40 recedes, the semiconductor 40 contacts the altered layer 6a at the outer peripheral edge portion of the protective layer 6. Hence, as shown in (c) in FIG. 4, the back channel side of the semiconductor layer 40 contacts the altered layer 6a that is a layer generated by the protective layer 6 being altered by dry etching, and also contacts the non-altered layer (bulk layer) that is the protective layer 6 not altered by the dry etching. In this case, the altered layer 6a and the non-altered layer have different amount of fixed charges. A larger amount of fixed charges is generated in the altered layer 6a which has been damaged. In such a manner, the parasitic transistor is caused because the semiconductor layer 40 contacts the altered layer 6a which includes a larger amount of fixed charges. It is considered that such a parasitic transistor causes the hump phenomenon in the current-voltage characteristics, as shown in FIG. 5A and FIG. 5B.

Figure 7:
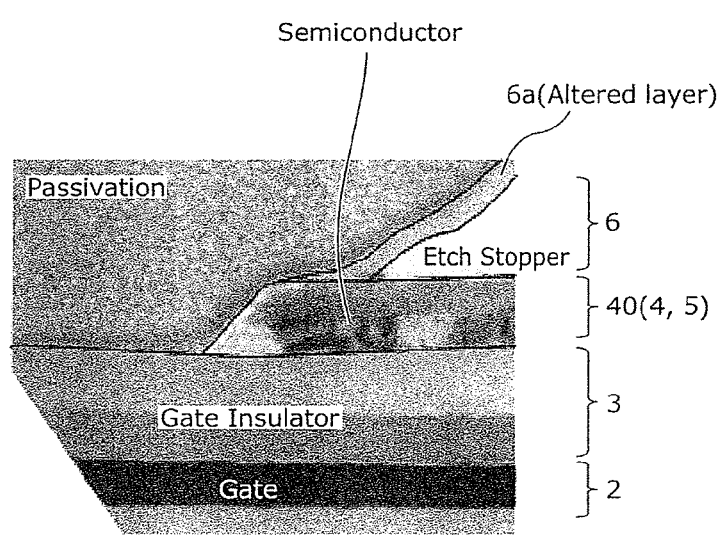
FIG. 7 is a cross-sectional TEM image of an outer peripheral edge portion of the protective layer of the conventional thin-film transistor shown in FIG. 4.

The conventional thin-film transistor 100 shown in FIG. 4 was actually manufactured, and cross-section observation was performed on the portion corresponding to (c) in FIG. 4 using a transmission electron microscope (TEM). FIG. 7 is a cross-sectional TEM image of the neighboring portions of the outer peripheral edge of the protective layer of the conventional thin-film transistor shown in FIG. 4. In FIG. 7, the passivation layer is also formed.

The cross-sectional TEM image shown in FIG. 7 shows that the altered layer 6a having a thickness of approximately 30 nm is present on the surface (sloped side) of the protective layer 6 and contacts the semiconductor layer 40 at the outer peripheral edge portion of the protective layer 6. Furthermore, since the color strength in the TEM image represents difference in density (volume density), the TEM image shows that a layer (the altered layer 6a) which is clearly different from the protective layer 6 is present near the surface of the protective layer 6. Furthermore, since the altered layer 6a is darker than the protective layer 6 serving as a base, it can be seen that the density of the altered layer 6a (volume density) is higher than the density (volume density) of the protective layer 6 (not altered portion) serving as a base.

Figure 8A:
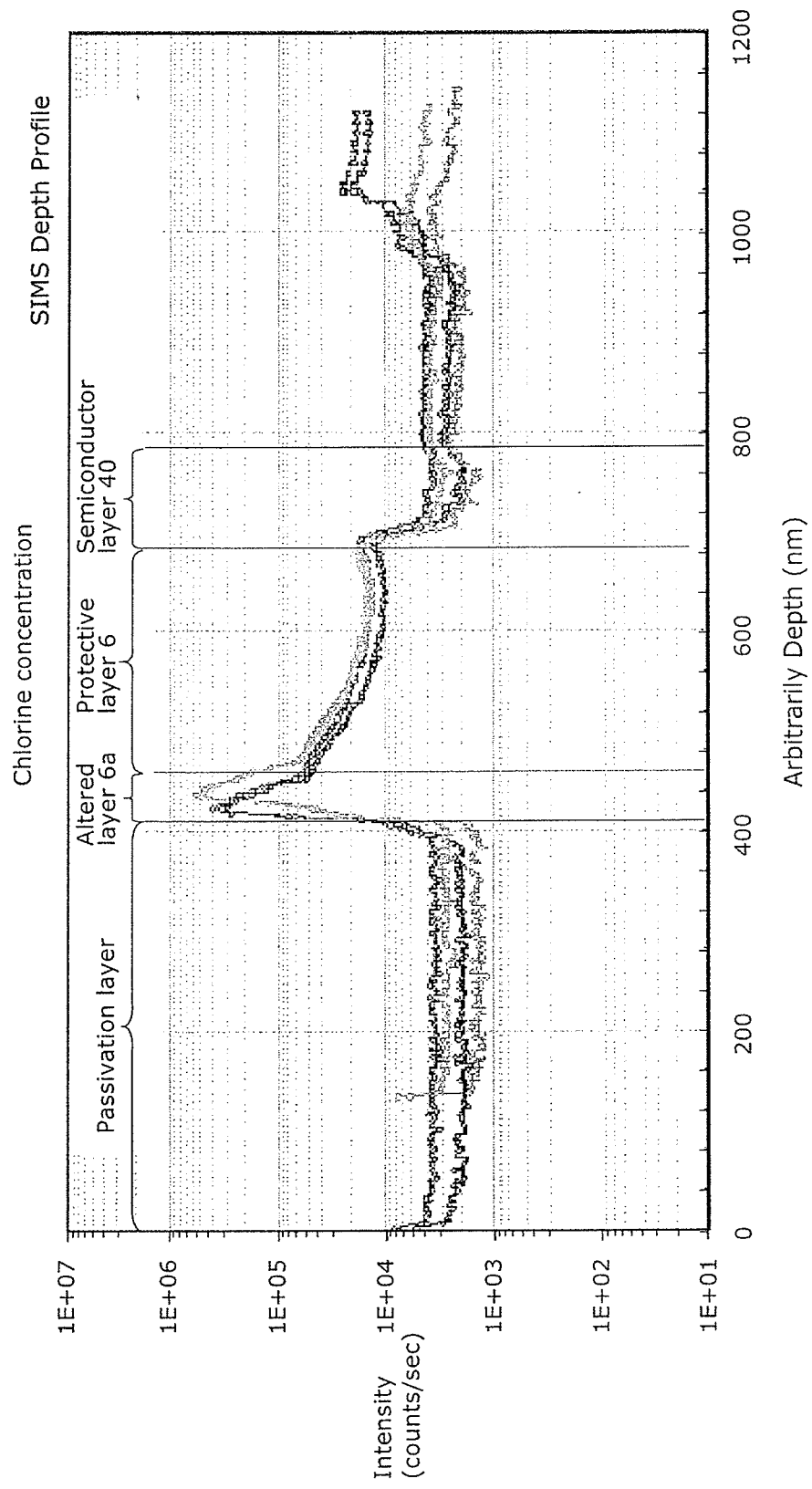
FIG. 8A shows concentration distribution of chlorine in films of the conventional thin-film transistor shown in FIG. 4.

Here, referring to FIG. 8A and FIG. 8B, a description is given of concentration distribution of chlorine (Cl) and carbon (C) in the conventional thin-film transistor 100. FIG. 8A shows concentration distribution of chlorine in films of the conventional thin-film transistor shown in FIG. 4. FIG. 8B shows concentration distribution of carbon in films of the conventional thin-film transistor shown in FIG. 4. Note that FIG. 8A and FIG. 8B show results of analysis performed on a single film with use of a secondary ion-microprobe mass spectrometer (SIMS). Furthermore, FIG. 8A and FIG. 8B each shows analysis results of multiple samples.

FIG. 8A shows that a layer, in which a larger amount of chlorine elements is detected than the other layers, is present between the passivation layer and the protective layer 6. Furthermore, FIG. 8B shows that a layer, which has a higher carbon concentration than that of the passivation layer and a lower carbon concentration than that of the protective layer 6, is present between the passivation layer and the protective layer 6. The layer which appears between the passivation layer and the protective layer 6 is the altered layer 6a which includes a large amount of chlorine elements that is a source gas used in dry etching, other than the composition of the organic application material of the protective layer 6. More specifically, the altered layer 6a is a layer generated by the protective layer 6 being altered by the source gas of the dry etching. Furthermore, since the altered layer 6a has a lower carbon concentration than that of the protective layer 6, it is considered that the altered layer 6a is generated by alteration of carbon in the protective layer 6. As described above, based on the results shown in FIG. 8A and FIG. 8B, it is understood that the altered layer 6a is a layer generated by the organic application material serving as a base for the protective layer 6 being combined with the source gas of dry etching.

FIG. 8A also shows that the altered layer 6a has a chlorine concentration at least ten times higher than that of the protective layer 6. Furthermore, FIG. 8B also shows that the altered layer 6a has a carbon concentration which is at most one hundredth of the carbon concentration of the protective layer 6.

As described above, the inventors found out that presence of the altered layer 6a causes hump phenomenon, and considered that modification of the altered layer 6a would reduce occurrence of the hump phenomenon.

In light of this, the inventors performed plasma treatment on the protective layer 6 as described above, based on the above finding. More specifically, after patterning the semiconductor layer 40 into an island shape by dry etching, plasma treatment was performed in a hydrogen atmosphere.

Figure 9:
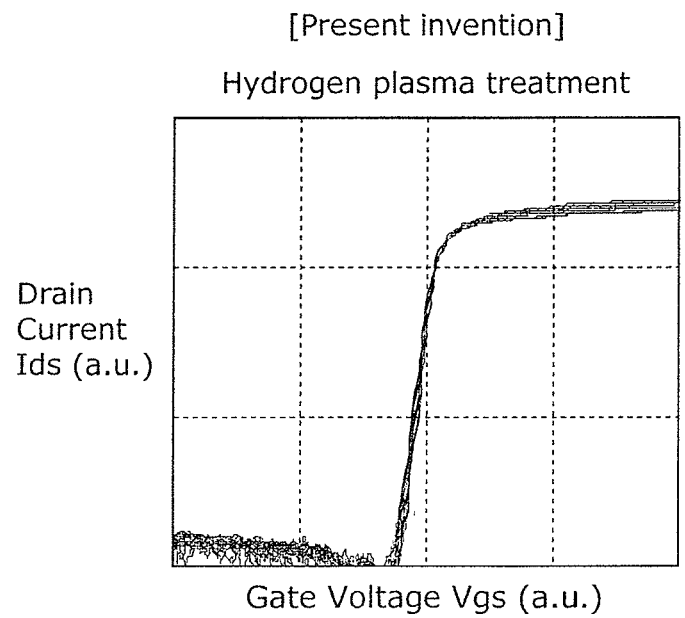
FIG. 9 illustrates current-voltage characteristics (Ids-Vgs characteristics) of the thin-film transistor according to the embodiment of the present invention.

The thin-film transistor 10 was actually manufactured by the manufacturing method shown in FIG. 3A to FIG. 3M, and current-voltage characteristics was measured. The results show the characteristics as shown in FIG. 9. FIG. 9 shows current-voltage characteristics (Ids-Vgs characteristics) of the thin-film transistor according to the embodiment of the present invention.

Figure 10:
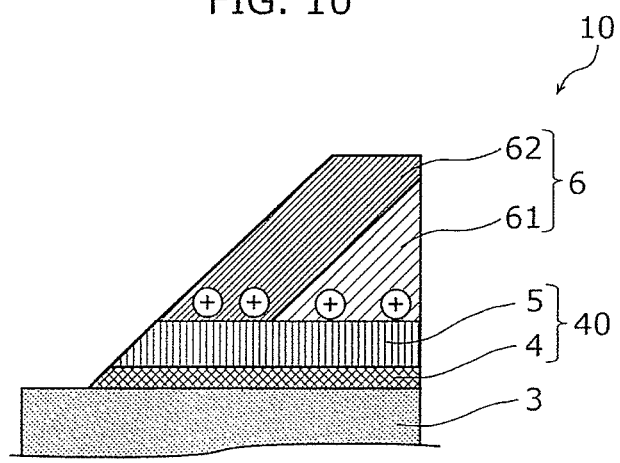
FIG. 10 is an enlarged cross-sectional view of neighboring portions of an outer peripheral edge of the protective layer in the thin-film transistor according to the embodiment of the present invention.

As shown in FIG. 9, the thin-film transistor 10 according to this embodiment does not include hump phenomenon in the current-voltage characteristics. FIG. 9 shows that the hump phenomenon, which was problematic particularly in the region where current rapidly increases, is not caused. The reason is that the altered layer 6a has been modified by the plasma treatment. This point shall be described with reference to FIG. 10. FIG. 10 is an enlarged cross-sectional view of the neighboring portions of the outer peripheral edge of the protective layer in the thin-film transistor according to this embodiment, and corresponds to (c) in FIG. 1. FIG. 10 schematically shows the amount of fixed charges at the back channel side of the semiconductor layer.

According to this embodiment, as shown in FIG. 10, performing plasma treatment on the altered layer 6a modifies the altered layer 6a generated near the surface of the protective layer 6 by dry etching, and the altered layer 6a turns into the modified layer 62. The modified layer 62 is a layer generated by the altered layer 6a being modified so that the threshold (threshold voltage) of the parasitic transistor is higher than that of the main transistor. The modification makes the amount of fixed charges in the modified layer 6a less than that in the altered layer 6a. The amount of fixed charges in the modified layer 62 can be reduced by plasma treatment to substantially same level as the amount of fixed charges in the non-altered layer 61 (more specifically, the amount of fixed charges in the protective layer 6 which has not been altered by dry etching). As a result, the protective layer 6 including the non-altered layer 61 and the modified layer 62 does not include unevenness in the amount of fixed charges caused due to the altered layer 6a before the plasma treatment, and includes a uniform amount of fixed charges throughout. With this, it is possible to equalize the amount of fixed charges at the back channel side of the semiconductor layer 40 within a surface of the substrate.

The concentration of chlorine and carbon in the altered layer 6a after the plasma treatment (that is, the modified layer 62) was measured with use of a secondary ion mass spectrometer. The measurement results are similar to the measurement results shown in FIG. 8A and FIG. 8B. This means that the chlorine concentration and carbon concentration in the altered layer 6a does not vary before and after the plasma treatment, and the modified layer 62 and the altered layer 6a have the same chlorine concentration and carbon concentration. More specifically, the modified layer 62 has a chlorine concentration at least ten times higher than that in the non-altered layer 61. Furthermore, the modified layer 62 has a carbon concentration at most one hundredth of the carbon concentration in the non-altered layer 61. Furthermore, the plasma treatment does not vary the thickness of the altered layer 6a. The modified layer 62 is comparable in thickness to the altered layer 6a. In this embodiment, the modified layer 62 has a thickness of at least 30 nm.

Figure 11:
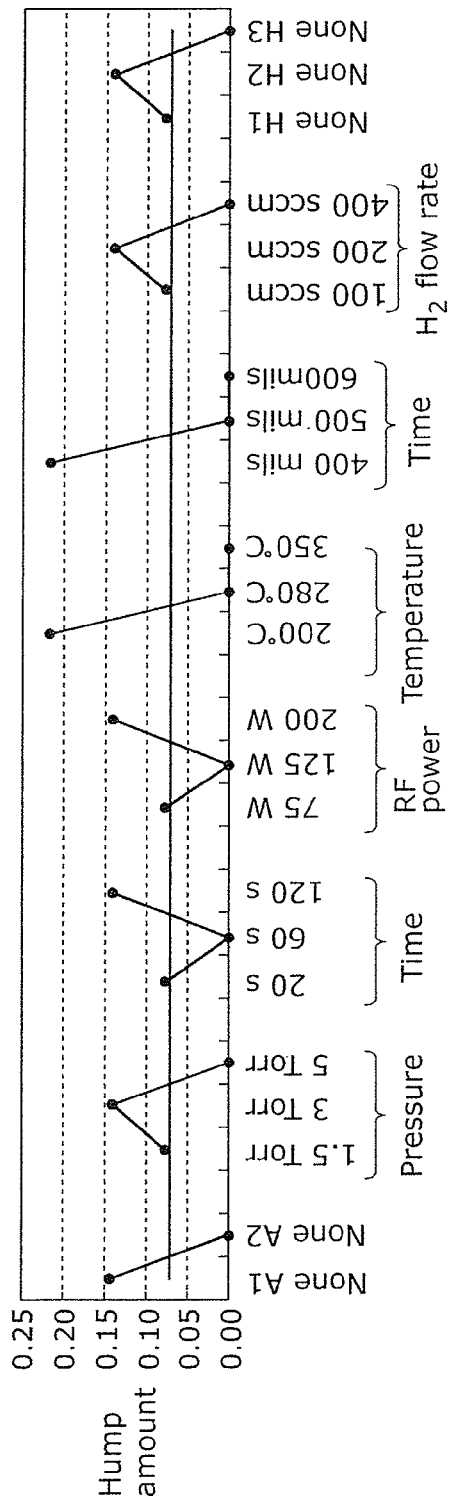
FIG. 11 shows cause and effect of plasma CVD under different conditions when the second plasma treatment in the method for manufacturing the thin-film transistor according to this embodiment is performed using orthogonal condition.

The inventors further found out control factors which modify the altered layer 6a and interaction, with use of design of experiments. This point shall be described with reference to FIG. 11. FIG. 11 shows cause and effect of plasma CVD under different conditions when the second plasma treatment in the method for manufacturing the thin-film transistor according to this embodiment is performed using orthogonal condition.

As shown in FIG. 11, effective factors were found by creating a cause and effect diagram of the amount of hump with the L18 orthogonal array. It is defined here that the hump amount is the peak value of the curve obtained by plotting, on the vertical axis, the second order derivative of the drain current value of the thin-film transistor and plotting the voltage value on the horizontal axis. More specifically, using the fact that the curve of the current-voltage characteristics becomes more steep as the hump phenomenon increases, the peak value of the second order derivative of the drain current was determined as the hump amount, and the hump amount was used as the quantitative index of the hump phenomenon.

The cause and effect diagram shown in FIG. 11 shows that the effective factors of the hump amount (hump phenomenon) are the substrate temperature (growth temperature) of the RF plasma CVD apparatus and the distance between the parallel-plate electrodes. The diagram also shows that the hump amount can be reduced by setting the substrate temperature to at least 280 degrees Celsius and setting the distance between the parallel-plate electrodes to at least 500 mm. For example, the substrate is set to a temperature of at least 280 degrees Celsius and at most 350 degrees Celsius, and the distance between the parallel-plate electrodes is at least 500 mm and at most 600 mm.

With the thin-film transistor 10 according to the embodiment of the present invention, the altered layer 6a, including a large amount of fixed charges formed near the surface of the protective layer 6 by dry etching, is modified by performing plasma treatment, thereby reducing the amount of fixed charges in the altered layer 6a. As a result, it is possible to reduce occurrence of the parasitic transistor caused due to the altered layer 6a, allowing a reduction in the hump phenomenon. This leads to a thin-film transistor with excellent transistor characteristics.

In particular, in this embodiment, it is possible to resolve hump phenomenon that occurs in the region where current rapidly increases in the current-voltage characteristics of the conventional technique. With this, use of the thin-film transistor 10 according to this embodiment as a driving transistor of the organic EL display improves characteristics in a low gray scale region (black display region) in a display device.

(Variation)

Figure 12:
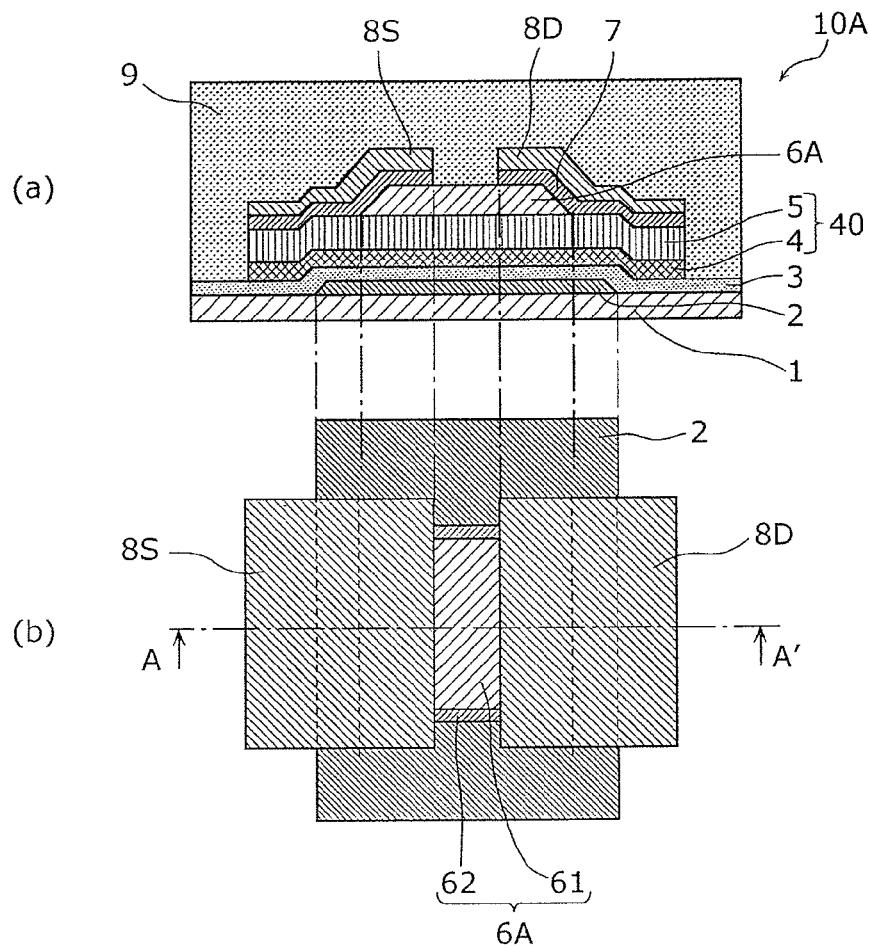
FIG. 12 schematically shows a configuration of a thin-film transistor according to Variation of the embodiment of the present invention.

Next, referring to FIG. 12, a description is given of a thin-film transistor 10A according to Variation of the embodiment of the present invention. FIG. 12 schematically shows a configuration of a thin-film transistor according to Variation of the embodiment of the present invention. In FIG. 12, (a) shows a cross-sectional view of the thin-film transistor taken along line A-A' in (b), and (b) shows a perspective plan view of the thin-film transistor.

As shown in FIG. 12, the thin-film transistor 10A according to Variation has a protective layer 6A which does not protrude from the source electrode 8S and the drain electrode 8D in the gate width direction. More specifically, in the thin-film transistor 10 according to the embodiment, the protective layer 6 protrudes from the source electrode 8S and the drain electrode 8D. In the thin-film transistor 10A according to Variation, the protective layer 6A does not protrude from the source electrode 8S and the drain electrode 8D. The lateral side of the protective layer 6B in the gate width direction recedes from the lateral side of the source electrode 8S and the drain electrode 8D in the gate width direction. The other structural elements are similar to those in the embodiment shown in FIG. 1.

The thin-film transistor 10A according to Variation produces the advantageous effects similar to those of the thin-film transistor 10 according to the above embodiment.

(Others)

Although the thin-film transistor and the method for manufacturing the thin-film transistor according to the present invention have been described based on the above embodiment and variation, the present invention is not limited to the embodiment and variation.

For example, although FIG. 4 and FIG. 10 show positive fixed charges as fixed charges, the fixed charges may be negative fixed charges. Furthermore, the fixed charges may exist either in the bulk of the layer and the interface between the layers. In the present invention, it is important that the amount of fixed charges at the back channel side viewed from the semiconductor layer 40 is equal in the outer peripheral edge portion and the central portion of the protective layer 6.

Furthermore, in the above embodiment and variation, the first plasma treatment is performed to cause hydrogen termination of dangling-bond of silicon element; however, the first plasma treatment need not necessarily be performed. For example, the first plasma treatment need not be performed when the semiconductor film 40F comprises oxide semiconductor or organic semiconductor, for example. Furthermore, the first plasma treatment need not necessarily be performed when the semiconductor film 40F is formed of a silicon film.

For example, the first plasma treatment may be performed before forming the protective layer 6. The reason is that when hydrogen plasma treatment is performed after forming the protective layer 6 comprising an organic application material including carbon, the generated hydrogen plasma removes carbon included in the protective layer 6 (in other words, the hydrogen plasma is consumed by the carbon in the protective layer 6). This may prevent the hydrogen plasma from arriving at the semiconductor film 40F. In particular, in the case where photosensitizing agent (naphthoquinone diazide or the like) used as an application material remains in the protective layer 6, the protective layer 6 and hydrogen plasma are likely to react with each other. This accelerates consumption of hydrogen plasma in the protective layer 6. Accordingly, it is preferable to perform hydrogen plasma treatment on the semiconductor film 40F before forming the protective layer 6.

Those skilled in the art will readily appreciate that many modifications and combinations are possible in the exemplary embodiment and variations without materially departing from the novel teachings and advantages of the present invention. Accordingly, all such modifications and combinations are intended to be included within the scope of the present invention.

Figure 13:
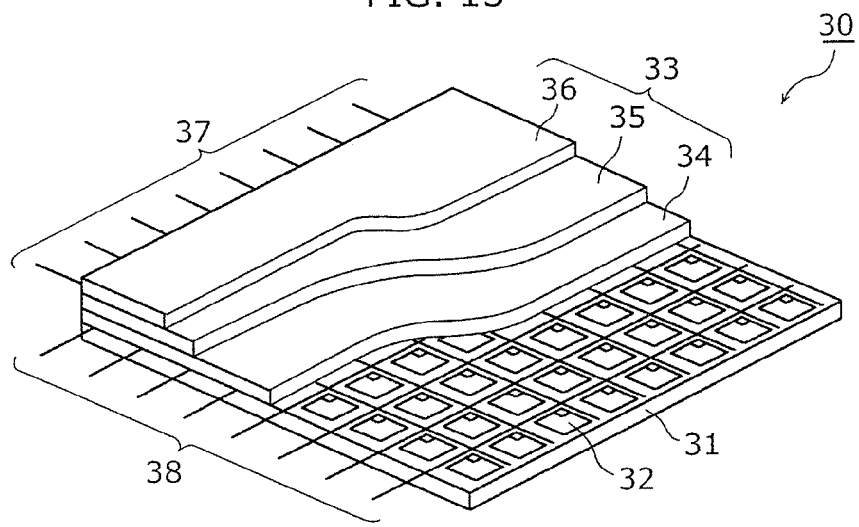
FIG. 13 is a partially cut perspective view of an organic EL display device according to the embodiment of the present invention.

Furthermore, the thin-film transistor according to this embodiment may be used as a display device, such as an organic EL display device, or a liquid crystal display device. For example, referring to FIG. 13, a description is given of an example where the thin-film transistor 10 according to the embodiment is applied to an organic EL display device. FIG. 13 is a partially cut perspective view of an organic EL display device according to the embodiment of the present invention.

As shown in FIG. 13, the organic EL display device 20 according to the embodiment includes: an active matrix substrate 21; a plurality of pixels 22 arranged in a matrix on the active matrix substrate 21; an organic EL device 23 formed corresponding to different one of the pixels 22; a plurality of gate lines 27 formed along a row direction of the pixels 22; a plurality of source lines 28 formed along a column direction of the pixels 22; and power lines 29 (not shown) formed in parallel with the source lines 28. The organic EL device 23 includes an anode 24, an organic EL layer 25, and a cathode 26 (transparent electrode) that are sequentially stacked on the active matrix substrate 21. The organic EL layer 25 includes a stack of an electron transport layer, an emission layer, a hole transport layer, and so on.

The thin-film transistor 10 according to this embodiment is provided as a switching transistor for selecting one of the pixels 22, but may be used as a driving transistor.

Figure 14:
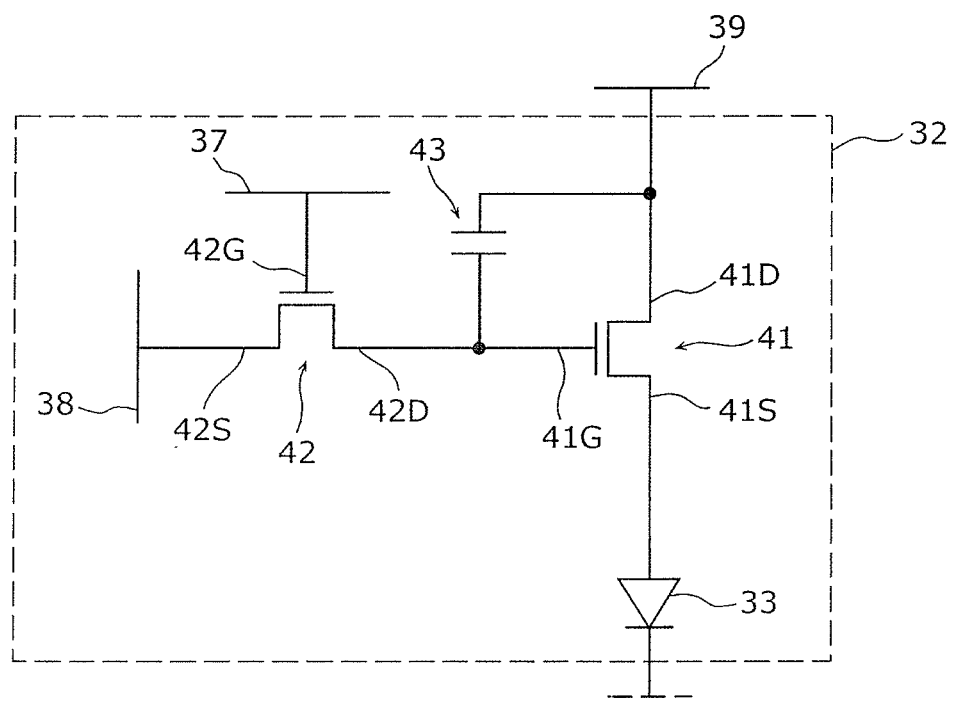
FIG. 14 shows a circuit configuration of a pixel which includes the thin-film transistor according to the embodiment of the present invention.

Next, referring to FIG. 14, a description is given of a circuit configuration of the pixel 22 in the organic EL display device 20. FIG. 14 shows a circuit configuration of a pixel which includes the thin-film transistor according to the embodiment of the present invention.

As shown in FIG. 14, each pixel 22 is partitioned by the gate line 27 and the source line 28 that are orthogonal to each other, and includes a driving transistor 31, a switching transistor 32, the organic EL device 23, and a capacitor 33. The driving transistor 31 is a transistor that drives the organic EL device 23. The switching transistor 32 is a transistor that selects the pixel 22.

In the driving transistor 31, a gate electrode 31G is connected to a drain electrode 32D of the switching transistor 32, a source electrode 31S is connected to the anode of the organic EL device 23 via a relay electrode (not shown), and a drain electrode 31D is connected to the power line 29.

In addition, in the switching transistor 32, the gate electrode 32G is connected to the gate 27, the source electrode 32S is connected to the source line 28, and the drain electrode 32D is connected to the capacitor 33 and the gate electrode 31G of the driving transistor 31.

In this configuration, when a gate signal is input into the gate line 27 to turn on the switching transistor 32, the video signal voltage supplied via the source line 28 is written into the capacitor 33. The video signal voltage written into the capacitor 33 is held for a period of one frame. The held video signal voltage causes analog change in conductance of the driving transistor 31 and causes the driving current corresponding to luminescence gradation to flow from the anode to the cathode of the organic EL device 23. This causes the organic EL device to emit light. As a result, a predetermined image is displayed.

In addition, the display device such as the organic EL display device according to this embodiment can be used as a flat-panel display, and is applicable to electronic devices such as television sets, personal computers, or mobile phones.

INDUSTRIAL APPLICABILITY

The thin-film transistor according to an aspect of the present invention is widely applicable to display devices such as television sets, personal computers, and mobile phones, or various electronic devices having thin-film transistors.

REFERENCE SIGNS LIST

1 Substrate
2, 31G, 32G, Gate electrode
3 Gate insulating layer
4 Crystalline silicon semiconductor layer
4F Crystalline silicon semiconductor film
5 Amorphous silicon semiconductor layer
5F Amorphous silicon semiconductor film
6, 6A Protective layer
6a Altered layer
7 Contact layer
7F Contact layer film
8S, 31S, 32S Source electrode
8D, 31D, 32D Drain electrode
8F Source-drain metal film
9, Passivation layer
10, 10A, 100 Thin-film transistor
20 Organic EL display device
21 Active matrix substrate
22 Pixel
23 Organic EL device
24 Anode
25 Organic EL layer
26 Cathode
27 Gate line
28 Source line
29 Power line
31 Driving transistor
32 Switching transistor
33 Capacitor
40 Semiconductor layer
40F Semiconductor film
61 Non-altered layer
62 Modified layer

The invention claimed is:

1. A thin-film transistor, comprising:
a gate electrode above a substrate;
a gate insulating layer above the gate electrode;
a semiconductor layer that is opposed to the gate electrode with the gate insulating layer therebetween;
an etch-stopper layer above the semiconductor layer and comprising an organic material; and
a source electrode and a drain electrode that are opposed to each other, each of the source electrode and the drain electrode having at least a portion located above the etch-stopper layer,
wherein the etch-stopper layer includes a modified layer in a region which (i) is in a surface of the etch-stopper layer exposed from the source electrode and the drain electrode and (ii) has at least a portion contacting a surface of the semiconductor layer, the modified layer being an altered layer that has been modified, the altered layer being generated by alteration of a material of the etch-stopper layer, and
wherein the modified layer has a chlorine concentration which is at least ten times higher than a chlorine concentration of the etch-stopper layer.

2. The thin-film transistor according to claim 1,
wherein the altered layer is a surface layer of the etch-stopper layer altered by dry etching performed to pattern the semiconductor layer.

3. The thin-film transistor according to claim 1,
wherein the modified layer has a thickness of at least 30 nm.

4. A thin-film transistor, comprising:
a gate electrode above a substrate;
a gate insulating layer above the gate electrode;
a semiconductor layer that is opposed to the gate electrode with the gate insulating layer therebetween;
an etch-stopper layer above the semiconductor layer and comprising an organic material; and
a source electrode and a drain electrode that are opposed to each other, each of the source electrode and the drain electrode having at least a portion located above the etch-stopper layer,
wherein the etch-stopper layer includes a modified layer in a region which (i) is in a surface of the etch-stopper layer exposed from the source electrode and the drain electrode and (ii) has at least a portion contacting a surface of the semiconductor layer, the modified layer being an altered layer that has been modified, the altered layer being generated by alteration of a material of the etch-stopper layer, and
wherein the modified layer has a carbon concentration which is at most one hundredth of a carbon concentration of the etch-stopper layer.

5. A thin-film transistor, comprising:
a gate electrode above a substrate;
a gate insulating layer above the gate electrode;
a semiconductor layer that is opposed to the gate electrode with the gate insulating layer therebetween;
an etch-stopper layer above the semiconductor layer and comprising an organic material; and
a source electrode and a drain electrode that are opposed to each other, each of the source electrode and the drain electrode having at least a portion located above the etch-stopper layer,
wherein the etch-stopper layer includes a modified layer in a region which (i) is in a surface of the etch-stopper layer exposed from the source electrode and the drain electrode and (ii) has at least a portion contacting a surface of the semiconductor layer, the modified layer being an altered layer that has been modified, the altered layer being generated by alteration of a material of the etch-stopper layer, and wherein the altered layer has a density higher than a density of a portion of the etch-stopper layer which is not altered by the dry etching.

6. A method for manufacturing a thin-film transistor, the method comprising:
preparing a substrate;
forming a gate electrode above the substrate;
forming a gate insulating layer above the gate electrode;
forming a semiconductor film above the gate insulating layer;
forming, above the semiconductor film, an etch-stopper layer comprising an organic material;
forming a source electrode and a drain electrode that are opposed to each other, each of the source electrode and the drain electrode having at least a portion located above the etch-stopper layer;
performing dry etching to (i) form, from the semiconductor film, a semiconductor layer, and (ii) form an altered layer by altering a surface layer of the etch-stopper layer exposed from the source electrode and the drain electrode, the altered layer having at least a portion contacting a surface of the semiconductor layer; and
performing plasma treatment on the altered layer in a hydrogen atmosphere.

7. A method for manufacturing a thin-film transistor, the method comprising:
preparing a substrate;
forming a gate electrode above the substrate;
forming a gate insulating layer above the gate electrode;
forming a semiconductor film above the gate insulating layer;
forming, above the semiconductor film, an etch-stopper layer comprising an organic material;
forming a source electrode and a drain electrode that are opposed to each other, each of the source electrode and the drain electrode having at least a portion located above the etch-stopper layer;
forming a semiconductor layer patterned, by performing dry etching on the semiconductor film; and
performing plasma treatment on an altered layer in a hydrogen atmosphere, the altered layer being a surface layer of the etch-stopper layer that is (i) exposed from the source electrode and the drain electrode and (ii) altered by the dry etching, the altered layer having at least a portion contacting a surface of the semiconductor layer,
wherein in the performing of plasma treatment on an altered layer, a parallel-plate electrode radio frequency (RF) plasma apparatus is used.

8. The method for manufacturing the thin-film transistor according to claim 7,
wherein the altered layer has a density higher than a density of a portion of the etch-stopper layer which is not altered by the dry etching.

9. The method for manufacturing the thin-film transistor according to claim 7,
wherein the altered layer has a thickness of at least 30 nm.

10. The method for manufacturing the thin-film transistor according to claim 7,
wherein the altered layer has a chlorine concentration which is at least ten times higher than a chlorine concentration of the etch-stopper layer.

11. The method for manufacturing the thin-film transistor according to claim 7,
wherein the altered layer has a carbon concentration which is at most one hundredth of a carbon concentration of the etch-stopper layer.

12. The method for manufacturing the thin-film transistor according to claim 7,
wherein in the performing of plasma treatment on an altered layer, the substrate is set to a temperature of at least 280 degrees Celsius and at most 350 degrees Celsius to generate plasma.

13. The method for manufacturing the thin-film transistor according to claim 7,
wherein in the performing of plasma treatment on an altered layer, a distance between parallel-plate electrodes of the parallel-plate electrode RF plasma apparatus is at least 500 mm and at most 600 mm.

14. The method for manufacturing the thin-film transistor according to claim 7,
wherein the semiconductor film is an oxide semiconductor film.

15. The method for manufacturing the thin-film transistor according to claim 7,
wherein the semiconductor film is a silicon film.

16. The method for manufacturing the thin-film transistor according to claim 15, further comprising:
performing plasma treatment as a first plasma treatment on the semiconductor film in a hydrogen atmosphere, before the forming of an etch-stopper layer,
wherein the performing of plasma treatment on an altered layer is performed as a second plasma treatment.

17. The method for manufacturing the thin-film transistor according to claim 16,
wherein the first plasma treatment is a process in which a dangling bond of a silicon element in the silicon film is hydrogen-terminated, and
the second plasma treatment is a process in which the altered layer is modified to equalize an amount of fixed charges in the altered layer and in a portion other than the altered layer in the etch-stopper layer.

18. The method for manufacturing the thin-film transistor according to claim 16,
wherein the second plasma treatment generates plasma having an intensity lower than an intensity of plasma generated by the first plasma treatment.

19. The method for manufacturing the thin-film transistor according to claim 18,
wherein each of the first plasma treatment and the second plasma treatment uses a parallel-plate electrode radio frequency (RF) plasma apparatus, and
a distance between parallel-plate electrodes of the parallel-plate electrode RF plasma apparatus is greater in the second plasma treatment than in the first plasma treatment.

* * * * *